(12) United States Patent
Yuzurihara et al.

(10) Patent No.: US 12,355,367 B2
(45) Date of Patent: Jul. 8, 2025

(54) WIDEBAND RF POWER SUPPLY AND CONTROL METHOD

(71) Applicant: KYOSAN ELECTRIC MFG. CO., LTD., Yokohama (JP)

(72) Inventors: Itsuo Yuzurihara, Yokohama (JP); Tomohiro Yoneyama, Yokohama (JP); Shohei Kobayashi, Yokohama (JP); Yu Hosoyamada, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 209 days.

(21) Appl. No.: 18/276,940

(22) PCT Filed: Dec. 17, 2021

(86) PCT No.: PCT/JP2021/046851
§ 371 (c)(1),
(2) Date: Aug. 11, 2023

(87) PCT Pub. No.: WO2022/176368
PCT Pub. Date: Aug. 25, 2022

(65) Prior Publication Data
US 2024/0048041 A1    Feb. 8, 2024

(30) Foreign Application Priority Data

Feb. 22, 2021  (JP) ................. 2021-026580

(51) Int. Cl.
*H02M 7/5395* (2006.01)
*H02M 1/12* (2006.01)
(Continued)

(52) U.S. Cl.
CPC ........... *H02M 7/5395* (2013.01); *H02M 1/12* (2013.01); *H02M 1/0054* (2021.05); *H02M 7/5387* (2013.01)

(58) Field of Classification Search
CPC ........ H02M 1/0054; H02M 1/12; H02M 1/44; H02M 7/537; H02M 7/5387;
(Continued)

(56) References Cited

U.S. PATENT DOCUMENTS

| 7,319,763 B2 | 1/2008 | Bank et al. |
| 2016/0056771 A1 | 2/2016 | Ibusuki |

(Continued)

FOREIGN PATENT DOCUMENTS

| CN | 104506112 A | * 4/2015 | ............ H02M 5/458 |
| EP | 1320927 B1 | 9/2008 | |

(Continued)

OTHER PUBLICATIONS

Machine translation of CN 104506112 (pub. Apr. 8, 2015). Obtained from internal USPTO database on May 10, 2025. (Year: 2025).*

(Continued)

*Primary Examiner* — Fred E Finch, III
(74) *Attorney, Agent, or Firm* — WHDA, LLP

(57) ABSTRACT

A carrier wave generation unit comprising a wideband RF power supply divides a whole modulation wave variable frequency range into a plurality of modulation wave frequency sections associated with the number of PWM pulses N based on upper and lower limit frequencies of a carrier wave. In each modulation wave frequency section, an integer number of PWM pulses N associated to each modulation wave frequency section and the modulation wave frequency fs are used to vary a carrier wave frequency fc based on the relationship of fc=N·fs, thereby synchronizing the frequency between a carrier wave C and a modulation wave S to satisfy periodicity.

14 Claims, 17 Drawing Sheets

(51) Int. Cl.
*H02M 7/5387* (2007.01)
*H02M 1/00* (2006.01)

(58) Field of Classification Search
CPC ......... H02M 7/53871; H02M 7/53875; H02M 7/539; H02M 7/5395
See application file for complete search history.

(56) References Cited

U.S. PATENT DOCUMENTS

| | | | |
|---|---|---|---|
| 2018/0076744 A1 | | 3/2018 | Wolf et al. |
| 2018/0219469 A1* | | 8/2018 | Yamashita .............. H02P 27/08 |
| 2018/0219508 A1 | | 8/2018 | Arisawa et al. |

FOREIGN PATENT DOCUMENTS

| | | |
|---|---|---|
| JP | 64-75316 A | 3/1989 |
| JP | 2001-320884 A | 11/2001 |
| JP | 2010-207084 A | 9/2010 |
| JP | 2012-165495 A | 8/2012 |
| JP | 2015-53824 A | 3/2015 |
| WO | 2017/026061 A1 | 2/2017 |

OTHER PUBLICATIONS

Decision to Grant Registration dated Dec. 12, 2024, issued in counterpart KR application No. 10-2023-7030993, with English translation. (3 pages).

Extended (Supplementary) European Search Report dated Jan. 27, 2025, issued in counterpart EP application No. 21926792.9. (8 pages).

International Search Report dated Feb. 8, 2022, issued in counterpart International Application No. PCT/JP2021/046851. (2 pages).

Taniguchi et al., "Modulation signal for three-phase sinusoidal PWM inverter", Paper of the Institute of Electrical Engineers of Japan No. 8, vol. 105, No. 10, pp. 880-886, w/English Translation. Cited in Specification. (16 pages). NPL Year: 1985.

* cited by examiner

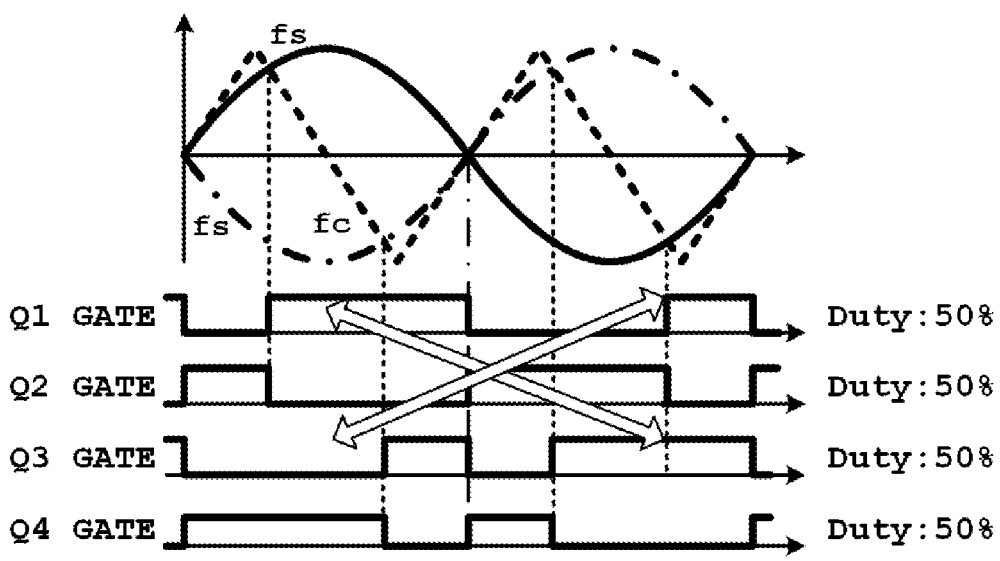
FIG.5(a) CARRIER WAVE C
(TRIANGULAR WAVE)   ODD FUNCTION
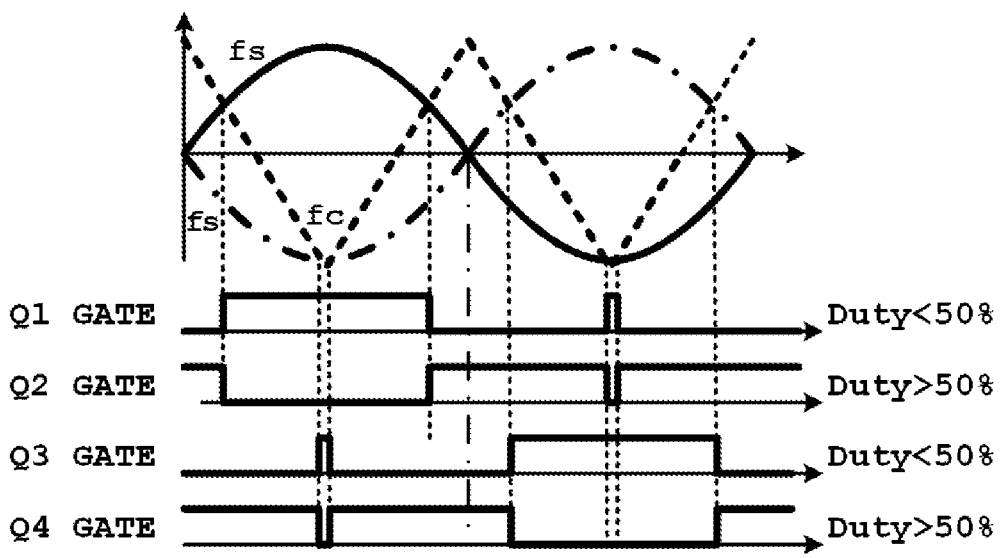
FIG.5(b) CARRIER WAVE C
(TRIANGULAR WAVE)   EVEN FUNCTION FIG.13(a) CARRIER WAVE (TRIANGULAR WAVE)
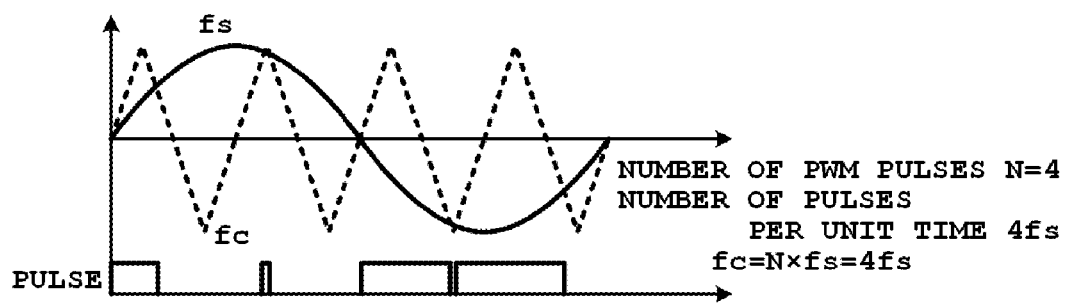
FIG.13(b) CARRIER WAVE (TRIANGULAR WAVE)
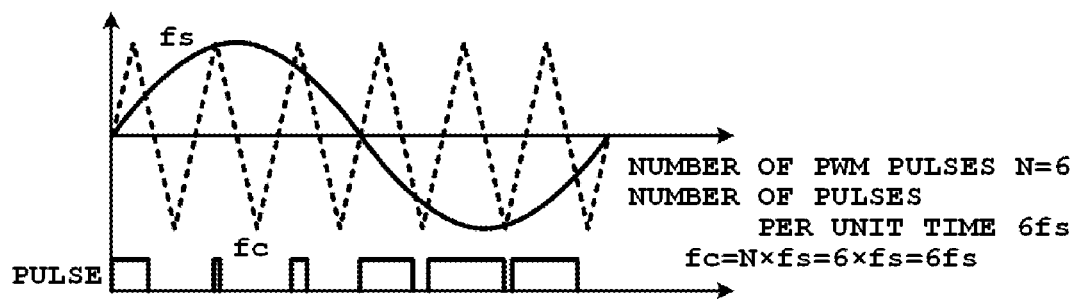

NUMBER OF PWM PULSES N

NUMBER OF PWM PULSES N: FIXED

NUMBER OF PWM PULSES N

SWITCHING LOSS Loss

NUMBER OF PWM PULSES N: VAIABLE (INTEGER)

FIG.15(a) NUMBER OF PWM PULSES N
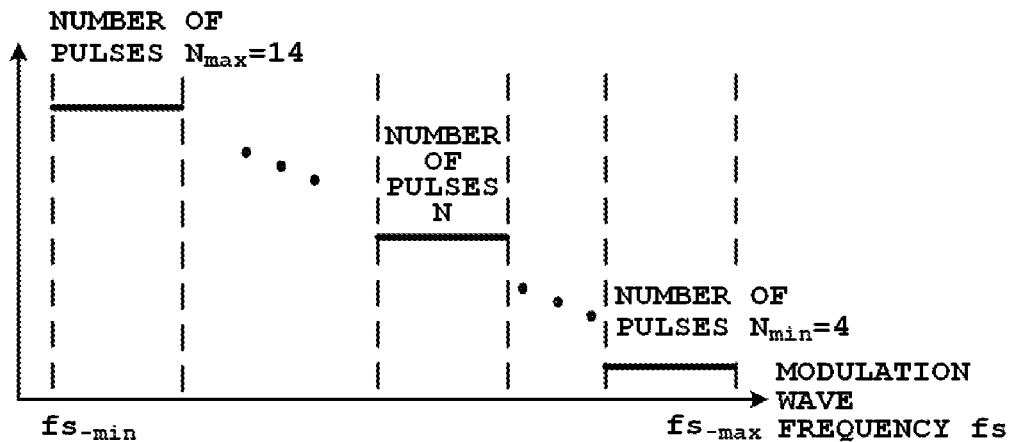
FIG.15(b) LOWEST HARMONIC ORDER $n_{-min}$
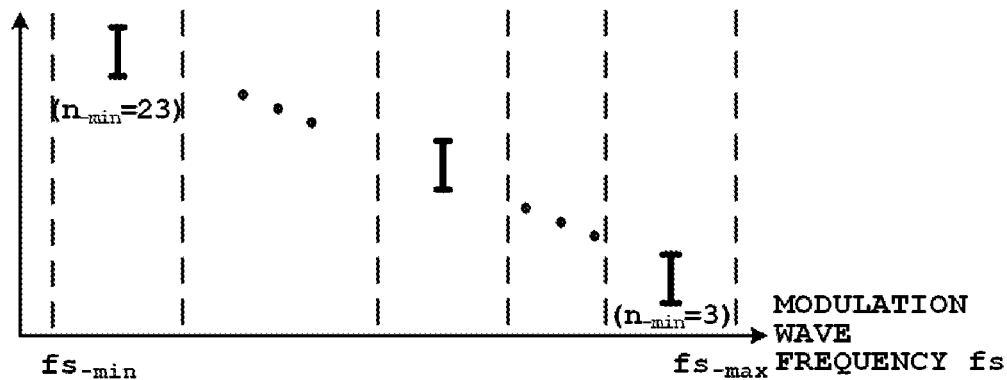
FIG.15(c) LOWEST HARMONIC FREQUENCY $f_{n-min}$
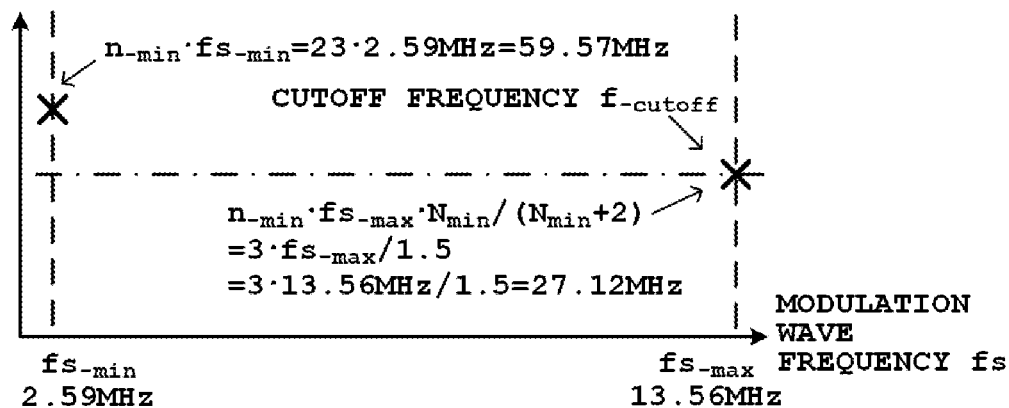

WIDEBAND RF POWER SUPPLY AND CONTROL METHOD

TECHNICAL FIELD

The present invention relates to a wideband RF power supply for outputting a wideband sine wave in a radio frequency (RF) band. The radio frequency (RF) band includes a low frequency (LF) band (30 kHz to 300 kHz), a medium frequency (MF) band (300 kHz to 3 MHz), a high frequency (HF) band (3 MHz to 30 MHz), a very high frequency (VHF) band (30 MHz to 300 MHz), and an ultrahigh frequency (UHF) band (300 MHz to 30 GHz). Under the current circumstances, the available frequency band of the wideband RF power supply of the present invention is from the LF band to the VHF band. The section of Detailed Description of the Invention below presents an example of utilizing the MF band and the HF band for the frequency band.

BACKGROUND ART

An analog amplifying circuit and a digital amplifying circuit are known as amplifying circuits in an RF band. The analog amplifying circuit falls under class-A, class-B or class-C depending on its bias amount. A class-D amplifying circuit is known as a digital amplifying circuit, which is composed of a single-phase square-wave inverter in an RF band. Conventionally, a wideband RF power supply for outputting a sine wave employs any of the class-A to class-C amplifying circuits. However, it is known that such an amplifying circuit has difficulty in increasing in capacity due to low efficiency with a large loss.

A class-D amplifying circuit composed of a single-phase pulse width modulation (PWM) inverter in an RF band includes a class-D full-bridge amplifier formed of a single-phase full-bridge circuit consisting of semiconductor switching elements, such as MOSFETs. The single-phase PWM inverter is used as a power conversion device for performing PWM control on a bridge circuit by switching on and off a semiconductor switching element, so as to convert a DC voltage in a DC power source into an AC voltage.

The power conversion device composed of the single-phase PWM inverter compares a modulation wave with a carrier wave to generate a PWM signal for controlling an ON/OFF operation, and controls the ON/OFF switching operation of the switching element of the inverter by using the generated PWM signal to thereby obtain a sine wave output. The frequency of the sine wave depends on the frequency of the modulation wave. Thus, the frequency of the modulation wave is variable in a wide band so that the frequency of the sine wave output can be varied in the wide band, and the modulation factor of the modulation wave is variable so that the output can be varied. Patent Literature 1 discloses a single-phase inverter with variable frequency according to a PWM method for sine wave modulation.

Non-Patent Literature 1 discloses pulse width modulation (PWM) for determining a pulse pattern with a carrier signal and a modulation signal, in which:

(a) an unnecessary harmonic component can be transferred to a high frequency range as a sideband of a carrier wave frequency, so that waveform improvement can be performed by increasing a frequency ratio between the carrier wave frequency and a fundamental wave frequency of an output;

(b) although the increase in a load loss caused by the unnecessary harmonic component can be reduced with increases in the carrier wave frequency in the PWM, a switching loss in a switching element increases in proportion to the number of times of switching; and (c) a PWM inverter defines the carrier wave frequency to be an integral multiple of a modulation wave frequency, so as to avoid interference of the sideband and a signal wave caused by the low carrier wave frequency.

Patent Literature 2 discloses an inverter device for converting DC power into commercial AC power, in which a frequency of a PWM carrier signal is set to be an integral multiple of a frequency of a current command signal so that switching operations of a first arm and a second arm of a single-phase full-bridge circuit can be synchronized. Patent Literature 2 shows an example that the frequency of the PWM carrier signal is set to 20 kHz, and the frequency of the current command signal is set to 50 Hz.

In a PWM inverter, it is required that N representing a relationship between a carrier wave frequency and a modulation wave frequency is required to be an integer number because N corresponds to the number of switching pulses in one period of the switching pulse, the switching pulse controlling the driving of a switching element.

CITATION LIST

Patent Literature

[Patent Literature 1] Japanese Patent Laid-Open Publication No. S64-75316 (75316/1989)
[Patent Literature 2] Japanese Patent Laid-Open Publication No. 2001-320884

Non-Patent Literature

[Non-Patent Literature 1] "Modulation Signal for Three-Phase Sine Wave PWM Inverter", Paper of the Institute of Electrical Engineers of Japan No. 8, Volume 105, No. 10, pages 880 to 886

SUMMARY OF THE INVENTION

Problems to be Solved by the Invention

A single-phase PWM inverter for outputting a wideband sine wave in an RF band is required to:
(a) reduce a switching loss; and
(b) remove a harmonic component by means of a single output filter.

Thus, there is a problem to be solved in an RF power supply that employs the single-phase PWM inverter.

In order to solve the problems of the switching loss reduction and the harmonic component removal using the single output filter, it is necessary to achieve synchronism in frequencies and phases between a carrier wave C and a modulation wave S in the generation of a PWM pulse signal for controlling a switching operation in the single-phase PWM inverter.

(Synchronism in Frequencies)

The synchronism in frequencies is an integral multiple relationship expressed by fc=N·fs between a carrier wave frequency fc and a modulation wave frequency fs, where N is an integer number, and the frequency fc of the carrier wave C is set to be an integral multiple of the frequency fs of the modulation wave S to synchronize the frequencies between both waveforms. The synchronism in the frequencies is synchronization between switching operations in a first arm to a fourth arm of a single-phase full-bridge circuit.

In Patent Literature 2 and Non-Patent Literature 1, the unknown number N is varied with variations in the modulation wave frequency fs with respect to a certain carrier wave frequency fc, so as to maintain the integral multiple relationship of fc=N·fs, where N is an integer number.
(Synchronism in Phases)

The synchronism in phases is a relationship where a phase of the carrier wave C is synchronized in one period of the modulation wave S. That is, a signal waveform of the carrier wave in the anterior half of one period of the modulation wave S and a signal waveform of the carrier wave in the posterior half of the period are made to be symmetrical at a time point of phase of n in the half period of the modulation wave S as a reference time point, so as to synchronize the phases of both waveforms. The synchronism in the phases ensures the symmetry of the waveform of the carrier wave C with respect to the reference point in one period of the modulation wave S, and equalizes switching losses among legs of the single-phase full-bridge circuit to suppress bias. The symmetry of the waveforms can be achieved if the carrier wave C is an odd function or an even function with respect to the modulation wave S.

The odd function satisfies a relationship of f(x)=−f(−x) with respect to an arbitrary number x, and is symmetrical about a point with respect to x=0 at the reference time point.

The even function satisfies a relationship of f(x)=f(−x) with respect to the arbitrary number x, and is symmetrical about time points before and after with respect to x=0 at the reference time point. In a case where the synchronism cannot be obtained in the frequencies or the phases, it appears as a synchronization deviation.

(a) Synchronization Deviation Between Frequencies

A method using a constant carrier wave frequency fc and a variable modulation wave frequency fs expresses the number of PWM pulses N as N=fc/fs. In an example that the carrier wave frequency fc is a constant frequency of 300 Hz, (1) if the modulation wave frequency fs is 60 Hz, the number of PWM pulses N is 5(=fc/fs=300/50),
(2) if the modulation wave frequency fs is 50 Hz, the number of PWM pulses N is 6(=fc/fs=300/60), and
(3) if the modulation wave frequency fs is 45 Hz, the number of PWM pulses N is 6.6667(=fc/fs=300/45).

The above items (1) and (2) are examples in which the respective numbers of PWM pulses N are integer. If the number of PWM pulses N satisfies a criterion of integer, there is an integral multiple relationship between the carrier wave frequency fc and the modulation wave frequency fs, and thereby the carrier wave C synchronizes with the modulation wave S. Fixed frequency (CVCF) control in UPS or similar can synchronize the carrier wave C with the modulation wave S.

By contrast, the above item (3) is an example in which the number of PWM pulses N is not an integer. In this example, since there is no integral multiple relationship between the carrier wave frequency fc and the modulation wave frequency fs, digital processing is performed to set the number of PWM pulses to an integer of 6 or 7. In the digital processing for setting the number of PWM pulses to an integer, the number of PWM pulses varies depending on which integer number is selected, resulting in synchronization deviations between the frequencies and the phases between the carrier wave C and the modulation wave S.

The frequency band of a sine wave output according to the present invention is a radio frequency (RF). The synchronization deviation in the sine wave output at this RF is different from the synchronization deviation in a frequency band of a commercial frequency in their aspects. The synchronization deviation in the frequency band of the commercial frequency is small enough to be ignored, whereas the synchronization deviation in the RF becomes too large to ignore.

(a1) Synchronization Deviation Between Frequencies in Commercial Frequency Band

In a commercial frequency band, a synchronization deviation that occurs in the sine wave output is small enough to be ignored. For example, when the modulation wave frequency fs is a commercial frequency, a carrier wave frequency fc at 20 kHz or higher is typically selected for use as shown in Patent Literature 2, such frequency being higher than audible frequency. Assuming that the carrier wave frequency fc is a fixed frequency of 21 kHz, if the modulation wave frequency fs is 60 Hz, the number of PWM pulses N is 350 that is an integer number. However, if the modulation wave frequency fs is 45 Hz, the number of PWM pulses N is N=fc/fs=21 kHz/45 Hz=466.67, and thus the number cannot be an integer. In such a case, if the digital processing is performed to set the number of PWM pulses N to an integer of 466 or 467, the carrier wave frequency fc becomes to 20.97 kHz or 21.02 kHz, and a variation range from 21 kHz is small. As above, since the number of PWM pulses is large in the frequency band of the commercial frequency, the synchronization deviation between the frequencies becomes small enough to be ignored. Consequently, there is no need to synchronize the modulation wave frequency fs with the carrier wave frequency fc.

(a2) Synchronization Deviation Between Frequencies in RF Frequency Band

By contrast, in the RF frequency band which is used for the sine wave output of the present invention, the synchronization deviation is too large to ignore, comparing to the synchronization deviation in the frequency band of the commercial frequency.

For example, in a case of setting the carrier wave frequency fc to 50 MHz, if the modulation wave frequency fs is 10.0 MHz, the number of PWM pulses N is N=fc/fs=50 MHz/10.0 MHz=5, and thus the relationship of the integral multiple N is built between the modulation wave frequency fs and the carrier wave frequency fc. If the modulation wave frequency fs changes to 11.0 MHz from this state, the number of PWM pulses N becomes to N=fc/fs=50 MHz/11.0 MHz=4.55, and consequently there is no integral multiple relationship. When the integral multiple relationship is not built, a change occurs in an output amplitude, causing a problem of occurrence of a low-frequency beat.

Furthermore, if the number of PWM pulses in the frequency band of the RF is large, as with in the band of the commercial frequency, the deviation of the frequency is small. However, since the frequency band is a high-frequency band, the carrier frequency is very high. In addition to that, if the large number of PWM pulses is applied, the switching loss grows excessively large, and it is therefore not suitable for a wideband RF power supply.

In variable frequency control for variable voltage variable frequency (VVVF) control, when the modulation wave frequency fs can be varied with respect to a certain carrier wave frequency fc, the unknown number N that satisfies the relationship of fc=N·fs may not be an integer number. Since the unknown number N needs to be an integer number in the inverter control, when the unknown number N converted into an integer number by the digital processing is used, the carrier wave frequency changes from the certain carrier wave frequency fc, and as a consequence the carrier wave frequency fc cannot be synchronized with the modulation wave frequency fs. As seen from the above, there is a problem of frequency deviation in the RF frequency band.

(b) Synchronization Deviation Between Phases

Even if the modulation wave frequency fs is in synchronization with the carrier wave frequency fc at a specific frequency, when the modulation wave frequency fs changes from the specific frequency and thus the state of the synchronization changes, the synchronization deviation occurs between the frequencies, and phase angles of the modulation wave S and the carrier wave C also vary in the zero to $2\pi$ range which causes a synchronization deviation between the phases. Due to this synchronization deviation between the phases, an odd function or an even function relationship cannot be maintained between the carrier wave C and the modulation wave S.

Since the synchronization deviations occur between the frequencies and the phases in the variable frequency control in the RF band, a problem of synchronism comes up in the frequencies or the phases.

In the single-phase PWM inverter which outputs the wideband sine wave in the RF band, the present invention is required to (a) reduce the switching loss and (b) remove the harmonic component by the single output filter to output a wideband sine wave in the RF band.

For solving the above problems, the variable frequency control in the RF band of the wideband RF power supply is required to provide synchronism in the frequencies and the phases between the carrier wave C and the modulation wave S when generating a PWM pulse signal for controlling the switching operation of the single-phase PWM inverter. In order to solve the above problems (a) and (b), the present invention intends to prevent the deviation of the frequencies and/or the phases between the carrier wave and the modulation wave S, and thereby outputs a sine wave having the synchronism in the frequencies and the phases over a wide band.

Means for Solving the Problem

<Wideband RF Power Supply>

A wideband RF power supply according to the present invention enables an output frequency to be variable over a wide band in an RF band to thereby output a sine wave. The wideband RF power supply includes a DC power source, a PWM inverter that converts a direct current supplied by the DC power source into an alternate current, an inverter controller that performs PWM control on the PWM inverter, and a low-pass filter that removes a harmonic component from an inverter output of the PWM inverter. The term "wideband" used in the present invention means that an output sine wave in a frequency band of an RF band has a broad bandwidth of a frequency range. The RF band is not limited to the frequency range within each frequency band from an LF band to a VHF band, and may be a frequency range across each frequency band.

The inverter controller of the present invention includes a PWM control unit that performs the PWM control on the PWM inverter, and a carrier wave generation unit that generates a carrier wave to be used for generating a PWM pulse for the PWM control.

For generating a carrier wave, the carrier wave generation unit has:

(a) a carrier wave variable frequency range where a frequency is limited by an upper limit frequency and a lower limit frequency; and (b) a modulation wave variable frequency range that is divided into a plurality of modulation wave frequency sections associated with the number of PWM pulses N, and (c) in each modulation wave frequency section, uses a modulation wave frequency fs and the number of PWM pulses N associated to the modulation wave frequency section within the concerned modulation wave frequency section to generate a carrier wave C at a carrier wave frequency fc based on a relationship of $fc=N \cdot fs$.

The carrier wave generation unit divides the whole modulation wave variable frequency range, in which the modulation wave frequency fs can be varied, into the plurality of modulation wave frequency sections associated with the number of PWM pulses N based on the upper limit and lower limit frequencies of the carrier wave. Then, the carrier wave generation unit uses in each modulation wave frequency section the integer number of PWM pulses N associated with the modulation wave frequency section and the modulation wave frequency fs within the concerned modulation wave frequency section to change the number of PWM pulses N, thereby varying the carrier wave frequency fc that satisfies the relationship of $fc=N \cdot fs$.

As described above, even when the modulation wave frequency fs varies over the wide band, the number of PWM pulses N is changed to one of those associated with respective modulation wave frequency sections that includes the varied modulation wave frequency fs, and the changed number of PWM pulses N is used to vary the carrier frequency fc based on the relationship of $fc=N \cdot fs$. This makes the frequencies between the carrier wave C and the modulation wave S to be synchronized to thereby satisfy the periodocity.

(Carrier Wave Generation Unit)

A configuration of the carrier wave generation unit includes:

(a) a carrier wave upper and lower limit frequency setting unit that sets an upper limit frequency $fc_{-upper}$ and a lower limit frequency $fc_{-lower}$ of the carrier wave C;

(b) a modulation wave frequency section setting unit that divides the whole modulation wave variable frequency range into a plurality of sections to set modulation wave frequency sections associated with the respective number of PWM pulses N;

(c) a carrier wave frequency computation unit that changes the number of PWM pulses N for the modulation wave frequency fs in each modulation wave frequency section into another number of PWM pulses N associated with a modulation wave frequency section that includes the concerned modulation wave frequency fs, and uses the changed number of PWM pulses N and the modulation wave frequency fs to compute the carrier wave frequency fc based on the relationship of $fc=N \cdot fs$; and (d) a carrier wave output unit that outputs the carrier wave C having the carrier wave frequency fc computed by the carrier wave frequency computation unit.

Another configuration of the carrier wave generation unit includes:

(e) a characteristic data storage unit that divides the modulation wave variable frequency range, and stores each number of PWM pulses N and each of the plurality of modulation wave frequency sections set by associating with the concerned number of PWM pulses N;

(f) a reading unit that reads the modulation wave frequency section that includes the modulation wave frequency fs and the corresponding number of PWM pulses N input from the characteristic data storage unit;

(c) the carrier wave frequency computation unit that changes the number of PWM pulses N for the modulation wave frequency fs in each modulation wave frequency section into another number of PWM pulses N associated with a modulation wave frequency section that includes the concerned modulation wave frequency fs, and uses the changed number of PWM pulses N and the modulation wave frequency fs to compute the carrier wave frequency fc based on the relationship of fc=N·fs; and (d) the carrier wave output unit that outputs the carrier wave having the carrier wave frequency fc computed by the carrier wave frequency computation unit.

The characteristic data on the number of PWM pulses N and the modulation wave frequency sections obtained by the above element (a) carrier wave upper and lower limit frequency setting unit and the element (b) modulation wave frequency section setting unit are stored in the element (e) characteristic data storage unit, and the element (f) reading unit reads the characteristic data from the element (e) characteristic data storage unit.

According to the above configuration, the carrier wave upper and lower limit frequency setting unit and the modulation wave frequency section setting unit obtain in advance the characteristic data on each number of PWM pulses N and each of the plurality of modulation wave frequency sections set by associating with the concerned number of PWM pulse N to store the obtained characteristic data in the characteristic data storage unit. Since this configuration stores the characteristic data as known data in the characteristic data storage unit, it is possible to obtain a carrier wave frequency every time the modulation wave frequency fs varies, without repeating the above process by the carrier wave upper and lower limit frequency setting unit and the modulation wave frequency section setting unit.

(PWM Control Unit)

The PWM control unit is configured to compare the modulation wave S with the carrier wave C to generate a PWM pulse for performing the PWM control on the PWM inverter, and to perform ON/OFF drive on a switching element of the PWM inverter with the generated PWM pulse to output a sine wave at a frequency that corresponds to the modulation wave frequency fs of the modulation wave S.

In the present invention, the range of the modulation wave frequency that enables the modulation wave to be varied is divided into a plurality of modulation wave frequency sections associated with the number of PWM pulses N. In a modulation wave frequency section associated with a frequency of the modulation wave frequency fs, the number of PWM pulses N is changed to the number of PWM pulses N that is associated with the concerned modulation wave frequency section. As to the carrier wave frequency, the carrier wave frequency fc associated with the number of PWM pulses N thus changed is determined based on the relationship of fc=N·fs.

The wideband frequency range of the RF band is divided into a plurality of modulation wave frequency sections, each modulation wave frequency section is selected by changing the number of PWM pulses N, the carrier wave frequency fc is determined in each selected modulation wave frequency section to prevent the synchronization deviations of the frequencies and the phases between the carrier wave C and the modulation wave S over the wide band of the RF band, thereby outputting a sine wave having the synchronism in the frequencies and the phases over the wide band.

The present invention sets the upper limit frequency $fc_{-upper}$ and the lower limit frequency $fc_{-lower}$ by the carrier wave upper and lower limit frequency setting unit, and sets the modulation wave frequency sections by the modulation wave frequency section setting unit, thereby dividing the wideband frequency range of the RF band into a plurality of modulation wave frequency sections associated with the number of PWM pulses N.

(Number of PWM Pulse N)

Requirement of even number of PWM pulses N:

Due to the synchronism in the frequencies and the phases, the modulation wave frequency fs and the carrier wave frequency fc have the relationship expressed by fc=N·fs according to the number of PWM pulses N. The number of PWM pulses N is therefore an even number due to the requirement of symmetry of the carrier wave C with respect to the modulation wave S.

An even-multiple relationship is built up between the modulation wave frequency fs and the carrier wave frequency fc to maintain the symmetry between a corrugated shape in an anterior half and a corrugated shape in a posterior half of one period of the modulation wave S as well as the symmetry of the PWM pulses associated with the symmetry between the corrugated shapes, so as to prevent the bias of the switching loss in a specific leg of the PWM inverter in one period of the modulation wave S.

When the carrier wave frequency fc has the relationship of fc=N·fs with the modulation wave frequency fs and is set to an even multiple N times as large as the modulation wave frequency fs, where N is an even number, a symmetry can be achieved between a signal waveform of the carrier wave C in an anterior half and a signal waveform of the carrier wave C in a posterior half of one period of the modulation wave S.

By contrast, when the carrier wave frequency fc has the relationship of fc=(N+1)·fs with the modulation wave frequency fs and is set to an odd multiple (N+1) times as large as the modulation wave frequency fs, where N is an even number, the symmetry is not satisfied because the signal waveform of the carrier wave C in the anterior half and the signal waveform of the carrier wave C in the posterior half in the one period of the modulation wave S have an inverted relationship with respect to a time axis.

By achieving the symmetry of the carrier wave C with respect to the modulation wave S, the signal waveform of the carrier wave C in the anterior half and the signal waveform of the carrier wave C in the posterior half in the one period of the modulation wave S are symmetrical at a point of phase n of the half period of the modulation wave S as a reference time point, thereby equalizing the switching losses among the legs and thus preventing the bias.

(Number of PWM Pulses N in Each Modulation Wave Frequency Sections)

(a) A minimum number of PWM pulses $N_{min}$, which is a minimum even number, is set as the number of PWM pulses N that is associated with a modulation wave frequency section on the highest frequency side which includes the maximum frequency of the modulation wave S.

(b) Values obtained by adding 2 to the minimum number of PWM pulses $N_{min}$ in order from the high frequency side to the low frequency side are set as the numbers of PWM pulses N that are associated with modulation wave frequency sections on the low frequency side of the modulation frequency S.

If the minimum number of PWM pulses $N_{min}$ is set to 4, values 6 and 8 and successive values are set as the number of PWM pulses N for the modulation wave frequency sections in order from the high frequency side to the low frequency side.

The small number of PWM pulses N is set with respect to the modulation wave frequency section on the high frequency side and the large number of PWM pulses N is set with respect to the modulation wave frequency section on the low frequency side, so that the carrier frequency fc in each modulation wave frequency section can be within a carrier frequency range included between the upper and lower limit frequencies of the carrier wave due to the relationship of fc=N·fs.

(Carrier Wave Upper and Lower Limit Frequency Setting Unit)

The carrier wave upper and lower limit frequency setting unit sets the upper limit frequency $fc_{-upper}$ and the lower limit frequency $fc_{-lower}$ of the carrier wave. In addition to that, the upper limit frequency $fc_{-upper}$ of the carrier wave is set with a product of the minimum number of PWM pulses $N_{min}$ in the modulation wave frequency section, which includes the maximum modulation wave frequency $fs_{-max}$, and the frequency $fs_{-max}$, and the lower limit frequency $fc_{-lower}$ is set with a product of the carrier wave upper limit frequency $fc_{-upper}$ and $N_{min}/(N_{min}+2)$.

(Modulation Wave Frequency Section Setting Unit)

The modulation wave frequency section setting unit divides the modulation wave frequency range to set into a plurality of modulation wave frequency sections in such a way that:

(a) the upper limit frequency $fc_{-upper}$ is used to define a maximum modulation wave frequency $fs_{-max}(N)$ and a minimum modulation frequency $fs_{-min}(N)$ in a modulation wave frequency section N when the carrier wave frequency fc in the modulation frequency section is shifted to the upper limit frequency $fc_{-upper}$, in which the maximum modulation wave frequency $fs_{-max}(N)$ is defined based on a relationship of $fs_{-max}(N)=fc_{-upper}/N$, and the minimum modulation wave frequency $fs_{-min}(N)$ is defined based on a relationship of $fs_{-min}(N)=fc_{-upper}/(N+2)$; and (b) the lower frequency $fc_{-lower}$ is used at $N>N_{min}$ to define the frequency $fs_{-min}(N)$ and frequency $fs_{-max}(N)$ when the carrier wave frequency fc in the modulation wave frequency section is shifted to the lower frequency $fc_{-lower}$, in which the minimum modulation wave frequency $fs_{-min}(N)$ in the modulation wave frequency section N is defined based on a relationship of $fs_{-min}(N)=fc_{-lower}/N$, and the maximum modulation wave frequency $fs_{-max}(N)$ is defined based on a relationship of $fs_{-max}(N)=fc_{-lower}/(N-2)$.

By comparing the case of shifting the carrier wave frequency fc to the lower limit frequency $fc_{-lower}$ with the case of shifting the frequency fc to the upper limit frequency $fc_{-upper}$ with respect to the number of total modulation wave frequency sections N, the value of the lower limit frequency $fc_{-lower}$ is smaller than the value of the upper limit frequency $fc_{-upper}$. Consequently, the total number of modulation wave frequency sections N in the case of shifting the frequency fc to the lower limit frequency $fc_{-lower}$ is smaller than that in the case of shifting to the upper limit frequency $fc_{-upper}$.

(Cutoff Frequency of Low-Pass Filter)

An inverter output of the PWM inverter contains a harmonic component together with a sine wave of the fundamental component. The low-pass filter removes the harmonic component contained in the inverter output, and then outputs the sine wave of the fundamental component. A cutoff frequency of the low-pass filter is a frequency that pass a fundamental sine wave frequency while cutting off a harmonic frequency. The harmonic frequency is represented by a product (n·fs) of a harmonic order n and the modulation wave frequency fs.

Between the number of PWM pulses N and the harmonic order n of the modulation wave S generated by the PWM inverter, the harmonic is generated from a low order side when the modulation wave frequency fs is high and the number of PWM pulses N is small, whereas the harmonic is generated from a high order side when the modulation wave frequency fs is low and the number of PWM pulses N is large.

Thus, it is set as a cutoff frequency of the low-pass filter whichever the frequency that cuts off the harmonic frequency on the low order side for the high modulation wave frequency fs or the frequency that cuts off the harmonic frequency on the high order side for the low modulation wave frequency fs is lower.

A minimum modulation wave frequency $fs_{-min}(N_{min})$ in a modulation wave frequency section which includes the maximum modulation wave frequency $fs_{-max}$ in the modulation wave variable frequency range is obtained by multiplying the maximum modulation wave frequency $fs_{-max}$ by $(N_{min}/(N_{min}+2))$.

(a) As a candidate for a cutoff frequency $f_{-cutoff}$, a frequency value $(n_{-min} \cdot fs_{-max} \cdot (N_{min}/(N_{min}+2))$ is obtained by multiplying a product $(n_{-min} \cdot fs_{-max})$ of the maximum modulation wave frequency $fs_{-mas}$ and a minimum harmonic order $n_{-min}$ resulting from the minimum number of PWM pulses $N_{min}$ associated with the maximum modulation wave frequency $fs_{-max}$ by $(N_{min}/(N_{min}+2))$. For example, when the selected minimum number of PWM pulses $N_{min}$ is 4, the minimum harmonic order $n_{-min}$ is 3, and thus the candidate for the cutoff frequency $f_{-cutoff}$ is $(3 \cdot fs_{-max} \cdot (2/3))$.

(b) As a candidate for the cutoff frequency $f_{-cutoff}$, a frequency value $(n_{-min} \cdot fs_{-min})$ is obtained by a product of the minimum modulation wave frequency $fs_{-min}$ and the minimum harmonic order $n_{-min}$ resulting from the number of PWM pulses N in the modulation wave frequency section. For example, when the number of PWM pulses N in the concerned modulation wave frequency section is 14, the minimum harmonic order $n_{-min}$ is 23, and thus the cutoff frequency $f_{-cutoff}$ is $(23 \cdot fs_{-min})$.

(c) Selection of Cutoff Frequency

In comparison of a cutoff frequency $f_{-cutoff-max}=n_{-min} \cdot fs_{-max} \cdot N_{min}/(N_{min}+2)$ of the modulation wave frequency fs in the modulation wave frequency section which includes the maximum modulation wave frequency $fs_{-max}$ and a cutoff frequency $f_{-cutoff-min}=n_{-min} \cdot fs_{-min}$ of the minimum modulation wave frequency $fs_{-min}$, provided that a ratio K between the cutoff frequencies $f_{-cutoff-max}$ and $f_{-cutoff-min}$ is $$K = f_{-cutoff-max}/f_{-cutoff-min}$$
$$= (n_{-min} \cdot fs_{-max} \cdot (N_{min}/(N_{min}+2)))/(n_{-min} \cdot fs_{-min}),$$

when K<1, the frequency $f_{-cutoff-max}=n_{-min} \cdot fs_{-max} \cdot N_{min}/(N_{min}+2)$ is selected as the cutoff frequency, and when K≥1, the frequency $f_{-cutoff-min}=n_{-min} \cdot fs_{-min}$ is selected as the cutoff frequency.

<Control Method for Wideband RF Power Supply>

A control method for a wideband RF power supply of the present invention is a method that compares the modulation wave S with the carrier wave C in the PWM inverter to control a wideband RF power supply that outputs a variable sine wave output frequency over a wide band in the RF band. The comparison of the modulation wave S and the carrier wave C can be performed based on a voltage or a current.

(Generation of Carrier Wave)

Generation of a carrier wave includes:
(a) a carrier wave upper and lower limit frequency setting step for setting an upper limit frequency and a lower limit frequency of the carrier wave;
(b) a modulation wave frequency section setting step for dividing a whole modulation wave variable frequency range into sections to set a plurality of modulation wave frequency sections associated with each number of PWM pulses N;
(c) a carrier wave frequency computing step for changing the number of PWM pulses N in the modulation wave frequency fs into the number corresponding to a modulation wave frequency section which includes the concerned modulation wave frequency fs, so as to compute the carrier wave frequency fc using the changed number of PWM pulses N and the modulation wave frequency fs based on the relationship of fc=N·fs;
(d) a carrier wave outputting step for outputting a carrier wave at the carrier wave frequency fc computed in the carrier wave frequency computing step;
(e) a PWM pulse outputting step for comparing voltages between the modulation wave S at the modulation wave frequency fs and the carrier wave C generated in a carrier wave outputting step and outputting a PWM pulse for performing PWM control the PWM inverter; and
(f) an outputting step for outputting a sine wave with an output frequency corresponding to the modulation wave frequency fs.

(Carrier Wave Upper and Lower Limit Frequency Setting Step)

The carrier wave upper and lower limit frequency setting step is for:
(a) setting an upper limit frequency $fc_{-upper}$ of the carrier wave by a product of the minimum number of PWM pulses $N_{min}$ in the modulation wave frequency section that includes the maximum modulation wave frequency $fs_{-max}$ and the frequency $fs_{-max}$; and
(b) setting a lower limit frequency $fc_{-lower}$ of the carrier wave by a product of the carrier wave upper frequency $fc_{-upper}$ and $(N_{min}/(N_{min}+2))$ (Modulation Wave Frequency Section Setting Step)

The modulation wave frequency section setting step performs the following processes:
(a) among a plurality of modulation wave frequency sections, in a modulation wave frequency section on the high frequency side that includes the maximum frequency of the modulation wave S, the maximum frequency of the concerned modulation wave S is set as the maximum frequency in the concerned modulation wave frequency section;
(b) among the plurality of modulation wave frequency sections, in the modulation wave frequency section on the low frequency side that includes the minimum frequency of the modulation wave S, the minimum frequency of the concerned modulation wave S is set as the minimum frequency in the concerned modulation wave frequency section;
(c) in order to lessen the total number of modulation wave frequency sections by shifting a frequency to the lower limit frequency fc-lower, a selection is made such that the product of the number of PWM pulses N in each modulation wave frequency section and the minimum modulation wave frequency in the concerned section is to be the carrier wave lower limit frequency $fc_{-lower}$; and
(d) when the frequency is shifted to the upper limit frequency $fc_{-upper}$, the selection is made such that the product of the number of PWM pulses N in each modulation wave frequency section and the maximum modulation wave frequency in the concerned section is to be the carrier wave upper limit frequency $fc_{-upper}$.

(Number of PWM Pulses N)

The number of PWM pulses N associated with a modulation wave frequency section on the highest frequency side which includes the maximum frequency of the modulation wave S is set as the minimum number of PWM pulses $N_{min}$ of even minimum value, and the number of PWM pulses N associated with a modulation wave frequency section on the low frequency side is set as value obtained by adding 2 to the minimum number of PWM pulses $N_{min}$ in order from the high frequency side to the low frequency side. If the minimum number of PWM pulses $N_{min}$ is set to 4, values of 6 and 8 and successive values are set as the number of PWM pulses N for the modulation wave frequency sections in order from the high frequency side to the low frequency side.

(Setting of Minimum Number of PWM Pulses $N_{min}$)

The setting of the minimum number of PWM pulses $N_{min}$ is performed on the basis of the balance of increase/decrease characteristics between increase characteristics in which the switching loss increases as the minimum number of PWM pulses $N_{min}$ increases and decrease characteristics in which an amount of generated harmonics decreases as the minimum number of PWM pulses $N_{min}$ increases.

(Outputting Step)

The outputting step defines the cutoff frequency $f_{-cutoff}$ of the low-pass filter, which removes a harmonic component from an inverter output of the PWM inverter, based on the smaller value either of:
(a) a frequency value $(n_{-min} \cdot fs_{-max} \cdot (N_{min}/(N_{min}+2))$ obtained by multiplying a product $(n_{-min} \cdot fs_{-max})$ of the maximum modulation wave frequency $fs_{-max}$ and the lowest harmonic order $n_{-min}$ resulting from the minimum number of PWM pulses $N_{min}$ associated with the maximum modulation wave frequency $fs_{-max}$ by a value $(N_{min}/(N_{min}+2))$; and
(b) a frequency value $(n_{-min} \cdot fs_{-min})$ obtained from a product of the minimum modulation wave frequency $fs_{-min}$ and the lowest harmonic order $n_{-min}$ resulting from the number of PWM pulses N in the modulation wave frequency section associated with the minimum modulation wave frequency $fs_{-min}$.

(Effects)

The present invention provides an effect of being able to output a wideband sine wave in the RF band by preventing the synchronization deviations of the frequencies and/or phases between the carrier wave C and the modulation wave S and maintaining the synchronism in the frequencies and/or phases, as well as an effect of reducing the switching loss in the RF band and an effect of outputting the wideband sine wave in the RF band by removing the harmonic component with the single output filter.

(Switching Loss)

By achieving the symmetry of the carrier wave C with respect to the modulation wave S, the signal wave of the carrier wave C in the anterior half and the signal wave of the carrier wave C in the posterior half in the one period of the modulation wave S are symmetrical at a time point of the phase n in the half period of the modulation wave S as a reference time point, thereby equalizing the switching losses among the legs and thus preventing bias.

The symmetry of the carrier wave with respect to the modulation wave S can be achieved by building the even multiple relationship between the modulation wave frequency fs and the carrier wave frequency fc, in addition to making the carrier wave C to have a waveform of the odd function or the even function.

(Single Output Filter)

Since the cutoff frequency of the low-pass filter, which removes the harmonics contained in the sine wave output, is defined based on the upper limit frequency $fc_{\_upper}$, the upper limit frequency $fc_{\_upper}$ can be set to suppress the cutoff frequency $f_{\_cutoff}$, and the low-pass filter that uses the cutoff frequency allows the single output filter to remove the harmonics contained in the wideband sine wave output.

Effect of the Invention

As described above, in accordance with the present invention, the variable frequency control in the RF band of the wideband RF power supply can prevent the synchronization deviations of the frequencies and phases between the carrier wave C and the modulation wave S, so as to output a sine wave having the synchronism in the frequencies and phases over a wide band.

The present invention can prevent the switching loss in the sine wave in the high-frequency band by the PWM inverter, thereby performing an operation in the high-frequency band for outputting a sine wave in the high-frequency band.

The present invention can perform the wide band operation on the wideband sine wave output to remove the harmonic component in the entire frequency band by the single output filter, so as to output the sine wave.

BRIEF DESCRIPTION OF THE DRAWINGS

FIGS. 5(a) and 5(b) are a diagram illustrating characteristics of an odd function and an even function of a carrier wave with respect to a modulation wave S;

FIGS. 13(a) and 13(b) are a diagram illustrating a relationship between a carrier wave C and the modulation wave S;

FIGS. 15(a) and 15(c) are a diagram illustrating a cutoff frequency of a low-pass filter;

BEST MODE FOR CARRYING OUT THE INVENTION

Figure 14:
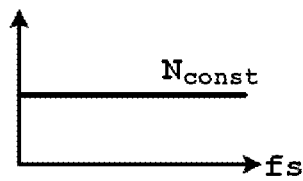
FIGS. 14(a) and 14(f) are a diagram illustrating a relationship of fc=N·fs.
Figure 14:
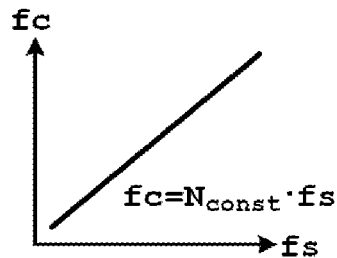
Figure 14:
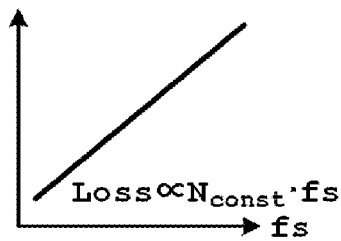
Figure 14:
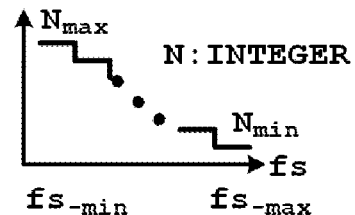
Figure 14:
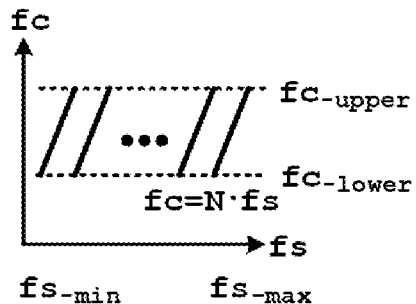
Figure 14:
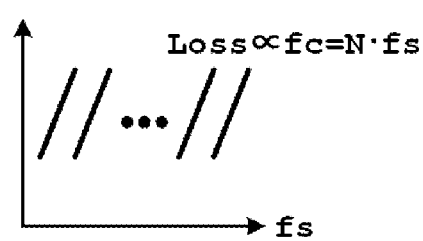
Figure 16:
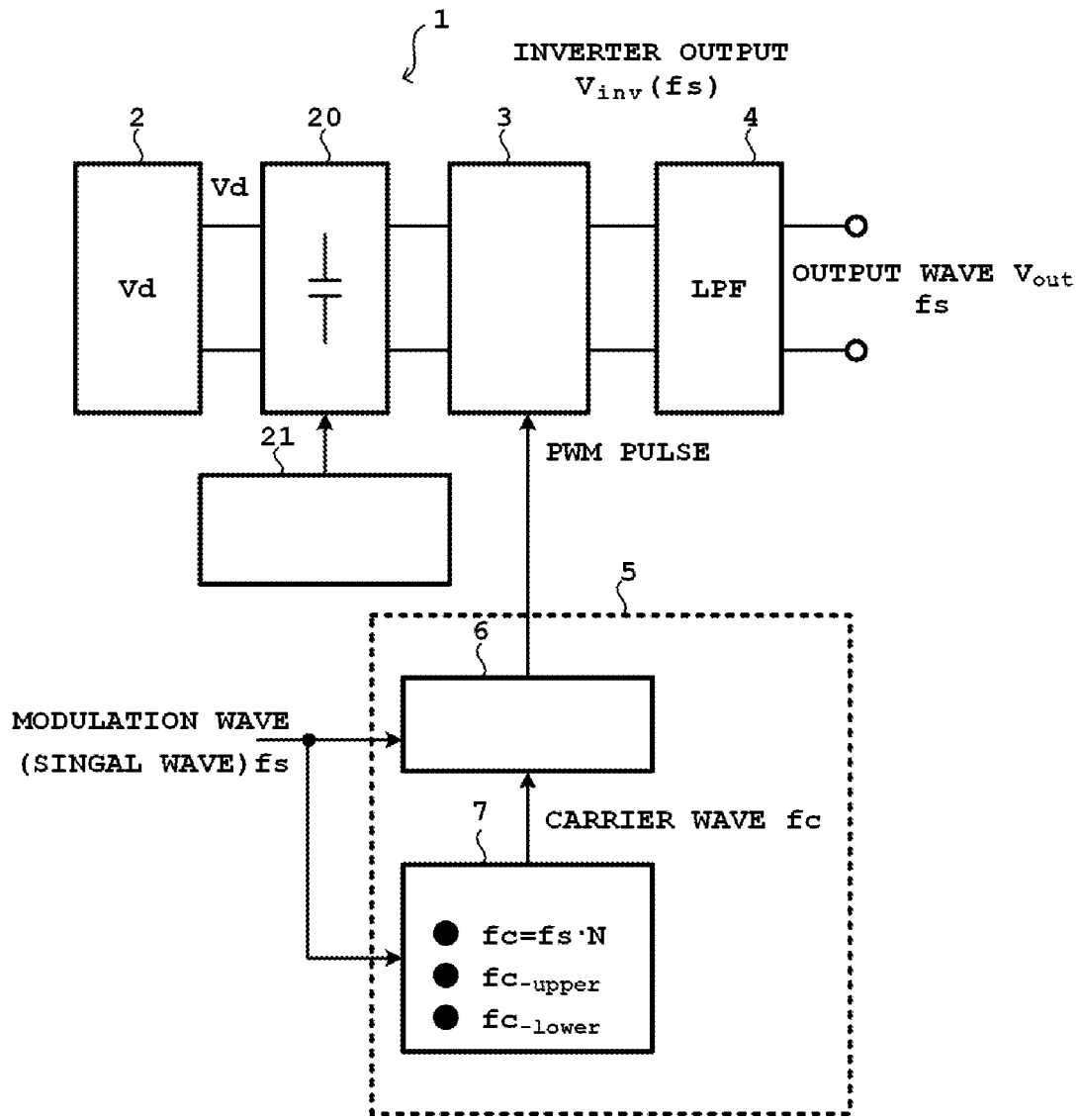
FIG. 16 is a diagram illustrating a configuration example for DC link voltage control.
Figure 17:
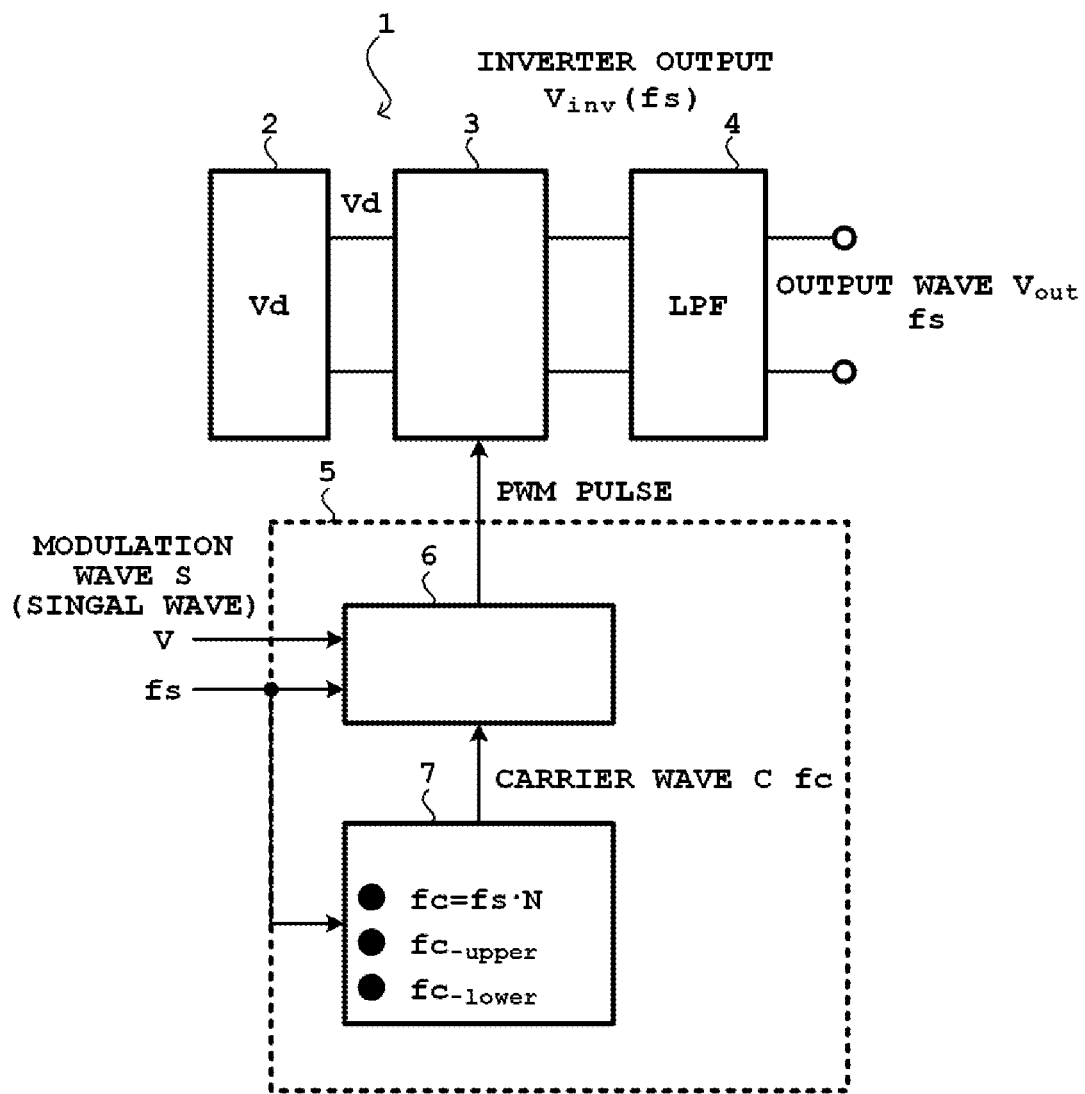
FIG. 17 is a diagram illustrating a configuration example for voltage control based on PWM control.

An outline and synchronism of a power supply (wideband RF power supply) of the present invention will now be described by referring to FIGS. 1 to 6, operational examples of the power supply will be described by referring to FIGS. 7 to 12, a switching loss in the power supply of the invention and a cutoff frequency of a low-pass filter will be described by referring to FIGS. 13 to 15, and configuration examples for voltage control will be described by referring to FIGS. 16 and 17.

<Schematic Configuration of Wideband RF Power Supply of the Invention>

Figure 1:
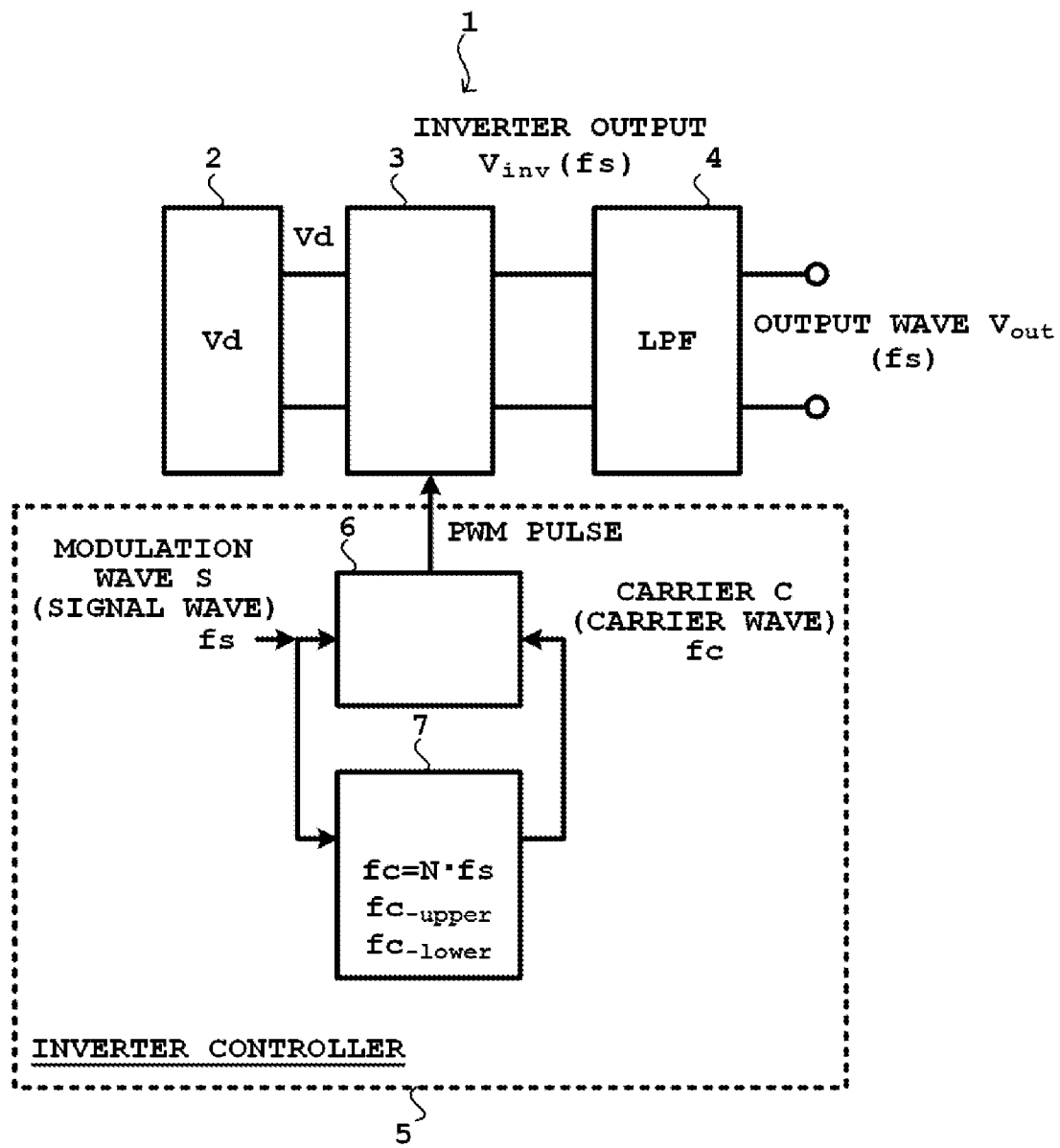
FIG. 1 is a schematic block diagram illustrating a schematic configuration of a wideband RF power supply according to the present invention.

FIG. 1 is a schematic diagram illustrating a schematic configuration of a wideband RF power supply of the present invention. In FIG. 1, a power supply (wideband RF power supply) 1 includes a DC power source 2 for outputting a DC voltage, a PWM inverter 3 for converting a DC voltage $V_d$ supplied by the DC power source 2 into an inverter output $V_{inv}$ and outputting an output $V_2$ obtained by voltage conversion by a transformer Tr, a low-pass filter 4 for removing a harmonic component in the output $V_2$ of the transformer Tr which is output by the PWM inverter 3, and an inverter controller 5 for performing PWM control on the PWM inverter 3. The inverter controller 5 includes a PWM control unit 6 and a carrier wave generation unit 7. The DC power source 2 may be one that outputs a DC voltage directly, as well as one that rectifies an AC voltage to thereby output a DC voltage.

The carrier wave generation unit 7 has:
(a) a carrier wave variable frequency range that is limited by an upper limit frequency and a lower limit frequency; and
(b) a modulation wave variable frequency range that is divided into a plurality of modulation wave frequency sections associated with the number of PWM pulses N, wherein
(c) in each modulation wave frequency section, a modulation wave frequency fs in a modulation wave frequency section and the number of PWM pulses N associated with the concerned modulation wave frequency section are used to generate a carrier wave C at a carrier wave frequency fc defined based on a relationship of fc=N·fs.

The PWM control unit 6 compares the carrier wave C generated by the carrier wave generation unit 7 with a modulation wave S to generate a PWM pulse for performing the PWM control on the PWM inverter 3. The PWM inverter 3 inverts the DC voltage $V_d$ to generate an inverter output $V_{inv}$ based on the PWM pulse.

The transformer Tr included in the PWM inverter 3 transforms the inverter output $V_{inv}$ into an output $V_2$ to thereby output it. The inverter output $V_{inv}$ contains a harmonic component together with a sine wave having a fundamental component, and the low-pass filter 4 removes the harmonic component contained in the output $V_2$ of the transformer Tr output by the PWM inverter 3 to output the sine wave having the fundamental component. A cutoff frequency $f_{-cutoff}$ of the low-pass filter 4 passes a fundamental sine wave frequency while cutting off a harmonic frequency, and is represented by a product (n·fs) of a harmonic order n and the modulation wave frequency fs.

In the PWM inverter 3, there is a relationship between the number of PWM pulses N and the harmonic order n of the modulated wave S generated by the ON/OFF operation of the pulse signal that the harmonic is generated from a lower order when the modulation wave frequency fs is high and the number of PWM pulses N is small, and the harmonic is generated in a higher order side when the modulation wave frequency fs is low and the number of PWM pulses N is large.

Accordingly, the lower one of frequencies that cuts off a low order harmonic set for the high modulation wave frequency fs or that cuts off a high order harmonic set for the low modulation wave frequency fs is set as the cutoff frequency $f_{-cutoff}$ of the low-pass filter.

In comparison of a cutoff frequency $f_{-cutoff\text{-}max} = n_{-min} \cdot fs_{-max} \cdot N_{min}/(N_{min}+2)$ in a modulation wave frequency section on the high frequency side that includes a maximum modulation wave frequency $fs_{-max}$ with a cutoff frequency $f_{-cutoff\text{-}min} = n_{-min} \cdot fs_{-min}$ of a minimum modulation wave frequency, provided that a ratio K between the cutoff frequencies $f_{-cutoff\text{-}max}$ and $f_{-cutoff\text{-}min}$ is $$K = f_{-cutoff\text{-}max}/f_{-cutoff\text{-}min}$$
$$= (n_{-min} \cdot fs_{-max} \cdot (N_{min}/(N_{min}+2)))/(n_{-min} \cdot fs_{-min}),$$

(a) when K<1, $f_{-cutoff\text{-}max} = n_{-min} \cdot fs_{-max} \cdot N_{min}/(N_{min}+2)$ is selected as the cutoff frequency, and (b) when K≥1, $f_{-cutoff\text{-}min} = n_{-min} \cdot fs_{-min}$ is selected as the cutoff frequency.

In the modulation wave frequency section on the high frequency side that includes the maximum modulation wave frequency $fs_{-max}$ in the modulation wave variable frequency range, the smallest value of the minimum modulation wave frequency $fs_{-min}$ is obtained by multiplying the maximum modulation wave frequency $fs_{-max}$ by $(N_{min}/(N_{min}+2))$, where $N_{min}$ is the smallest number of PWM pulses N.

Figure 2:
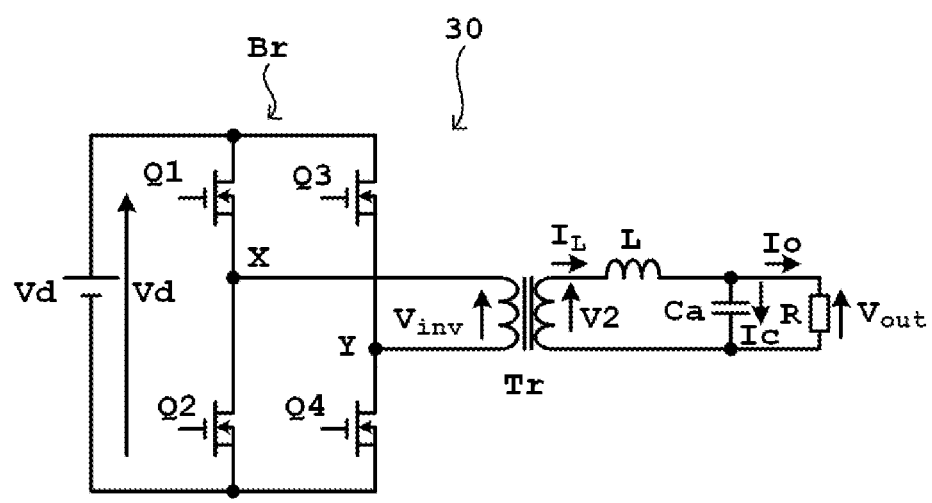
FIG. 2 is a circuit diagram illustrating configuration examples of a PWM inverter and a low-pass filter.

FIG. 2 shows a circuit example illustrating configuration examples of the PWM inverter 3 and the low-pass filter 4.

The PWM inverter 3 includes a class-D full-bridge amplifier 30. The class-D full-bridge amplifier 30 includes a single-phase full-bridge circuit Br and an output transformer Tr, in which the single-phase full-bridge circuit Br inverts the DC voltage $V_d$ in the DC power source by a switching operation to thereby generate the inverter output $V_{inv}$, and the output transformer Tr outputs the output $V_2$ with a PWM pulse waveform. The single-phase full-bridge circuit Br includes four switching elements, namely switching elements Q1, Q2 and switching elements Q3, Q4, and the switching element Q1 and the switching element Q2 form a series circuit serving as one leg and the switching element Q3 and switching element Q4 form a series circuit serving as the other leg, thereby constituting a single-phase bridge circuit. The switching elements Q1 and Q3 have their high voltage sides connected to the high voltage side of the DC power source, and the switching element Q2 and the switching element Q4 have their low voltage sides connected to the low voltage side of the DC power source. Furthermore, a point X of one of the legs and a point Y of the other of the legs are connected to the input side of the output transformer Tr. The PWM inverter 3 switches the ON/OFF operations of the switching elements Q1, Q2 and the switching elements Q3, Q4 with the PWM pulse to invert the DC voltage $V_d$ into the AC voltage $V_{inv}$.

The AC voltage $V_{inv}$ thus inverted by the PWM inverter 3 is transformed in the AC voltage $V_2$ by the output transformer Tr. The low-pass filter 4 is connected to the output side of the output transformer Tr, so as to input the output $V_2$ of the AC voltage with the PWM pulse waveform. The low-pass filter 4 consists of an LC circuit comprising an inductor L and a capacitor Ca, for example, and is configured to remove a harmonic component contained in the output $V_2$ of the AC voltage with the PWM pulse waveform to obtain a sine wave output $V_{out}$, thereby supplying the output $V_{out}$ to a load R.

(A) Synchronism Between Frequencies in Wide Band

In the present invention, the wideband frequency range in the RF band is divided into a plurality of modulation wave frequency sections, the number of PWM pulses N is changed to select each modulation wave frequency section, the carrier wave frequency fc is determined in the selected modulation wave frequency section, in the wide band of the RF band, to thereby prevent synchronization deviations in frequencies and phases between the carrier wave C and the modulation wave S, and consequently a sine wave having synchronism in frequencies and phases is output over a wide band.

The whole modulation wave variable frequency range where the modulation wave frequency fs is variable is divided into a plurality of modulation wave frequency sections associated with the number of PWM pulses N based on the upper limit and lower limit frequencies of the carrier wave. In each modulation wave frequency section, the value of the carrier frequency fc that satisfies the relationship of fc=N·fs is varied according to the modulation wave frequency fs and the integral number of PWM pulses N that is associated with each modulation wave frequency section.

In this way, even in a case where the modulation wave frequency fs changes over the wide band, the number of PWM pulses N is changed to one that is associated with a modulation wave frequency section that contains the changed modulation wave frequency fs to enable the carrier frequency fc to be varied based on the relationship of fc=N·fs, thereby synchronizing the frequencies between the carrier wave and the modulation wave S to satisfy the periodicity.

With reference to FIG. 3, a description will be made about the synchronism between the frequencies in the wide band. FIG. 3 shows an example of shifting the carrier frequency fc to the lower limit frequency $fc_{-lower}$. In the present invention, the modulation wave variable frequency range, in which the frequency is variable, is divided into a plurality of modulation wave frequency sections associated with the number of PWM pulses N. In FIG. 3, modulation wave variable frequency ranges [$fs_{-max}$, $fs_{-min}$] are ranges of the maximum modulation wave frequency $fs_{-max}$ and the minimum modulation wave frequency $fs_{-min}$, and these ranges can be set arbitrary based on a frequency range of a sine wave output from the wideband RF power supply if need arises. In addition, modulation wave variable frequency ranges [a, b] represent frequency ranges, where the ranges a and b have a magnitude relationship of a>b.

The band of radio frequency (RF) includes a low frequency (LF) band (30 to 300 kHz), a medium frequency (MF) band (300 kHz to 3 MHz), a high frequency (HF) band (3 MHz to 30 MHz), a very high frequency (VHF) band (30 MHz to 300 MHz), and an ultrahigh frequency (UHF) band (300 MHz to 30 GHz). FIG. 3 shows an example of the modulation wave variable frequency ranges [$fs_{-max}$, $fs_{-min}$], and the modulation wave variable frequency range is defined to be [13.56 MHZ, 2.59 MHz] in the MF band and the HF band.

Figure 3A:
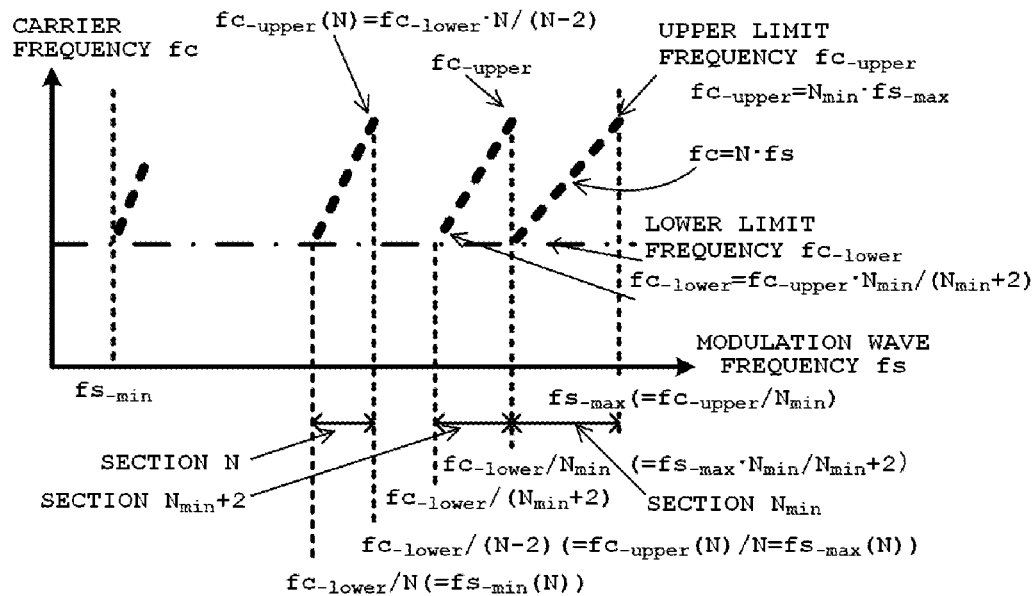
FIGS. 3(a) and 3(b) are a diagram showing an example of shifting a frequency to a lower limit frequency $fc_{\_lower}$, and illustrating synchronism in frequencies in a wide band.
Figure 3B:
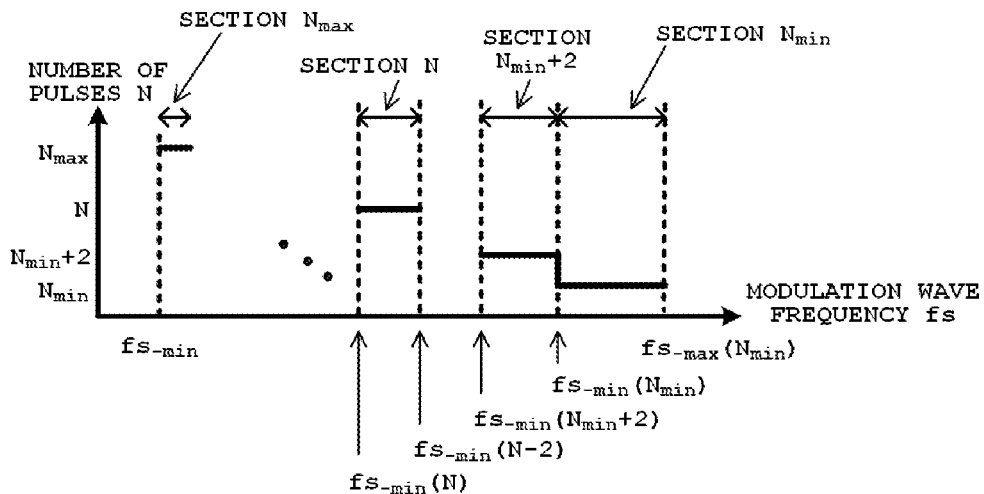

FIG. 3(a) shows a relationship between the modulation wave frequency fs and the carrier wave frequency fc, and FIG. 3(b) shows a relationship between the modulation wave frequency fs and the number of PWM pulses N.

(a) Relationship Between Modulation Wave Frequency fs and Carrier Wave Frequency fc:

In the relationship between the modulation wave frequency fs and the carrier wave frequency fc shown in FIG. 3(a), the upper limit frequency $fc_{-upper}$ and the lower limit frequency $fc_{-lower}$ of the carrier wave frequency fc are set.

(a1) Setting of Carrier Wave Upper and Lower Limit Frequencies

The upper limit frequency $fc_{-upper}$ of the carrier wave is set by a product of the minimum number of PWM pulses $N_{min}$ in a modulation wave frequency section that includes the maximum modulation wave frequency $fs_{-max}$ and the maximum modulation frequency $fs_{-max}$, and the lower limit frequency $fc_{-lower}$ is set by a product of the carrier wave upper limit frequency $fc_{-upper}$ and $N_{min}/(N_{min}+2)$ (a2) Setting of Modulation Wave Frequency Sections Setting of a modulation wave frequency section among a plurality of modulation wave frequency section is made as below.

(1) In a modulation wave frequency section on the high frequency side that contains the maximum frequency of the modulation wave, the maximum frequency $fs_{-max}$ of this modulation wave frequency is set as the maximum frequency in this modulation wave frequency section.

(2) In a case of reducing the total number of the modulation wave frequency sections by shifting the carrier wave frequency in the modulation wave frequency section to the lower limit frequency $fc_{-lower}$, the value of the lower limit frequency $fc_{-lower}$ is used to set values of $fs_{-min}(N)$ and $fs_{-max}(N)$. When $N>N_{min}$, the minimum modulation wave frequency $fs_{-min}(N)$ in a modulation wave frequency section N is set by an equation of $fs_{-min}(N)=fc_{-lower}/N$, and the maximum modulation wave frequency $fs_{-max}(N)$ in the modulation wave frequency section N is set by an equation of $fs_{-max}(N)=fc_{-lower}/(N-2)$.

(3) In a case of shifting the carrier wave frequency in the modulation wave frequency section to the upper limit frequency $fc_{-upper}$, the upper limit frequency $fc_{-upper}$ is used to define the values of the maximum modulation wave frequency $fs_{-max}(N)$ and the minimum modulation wave frequency $fs_{-min}(N)$. The maximum modulation wave frequency $fs_{-max}(N)$ in the modulation wave frequency section N is set by an equation of $fs_{-max}(N)=fc_{-upper}/N$, and the minimum modulation wave frequency $fs_{-min}(N)$ in the modulation wave frequency section N is set by an equation of $fs_{-min}(N)=fc_{-upper}/(N+2)$.

Based on the setting of the upper limit frequency $fc_{-upper}$ and the lower limit frequency $fc_{-lower}$ of the carrier wave and the setting of the modulation wave frequency sections, the wideband frequency range in the RF band is divided into a plurality of modulation wave frequency sections associated with the number of PWM pulses N.

In a modulation wave frequency section corresponding to the modulation wave frequency fs, the number of PWM pulses N is changed to one associated with this modulation wave frequency section, and the carrier wave frequency fc that corresponds to the changed number of PWM pulses N is obtained based on the relationship of fc=N·fs.

The modulation wave frequency section on the high frequency side that contains the maximum modulation wave frequency $fs_{-max}$ in the modulation wave variable frequency range is represented by [$fs_{-max}$, $fs_{-max} \cdot N_{min}/(N_{min}+2)$]. The carrier wave frequency fc is set by a frequency section between an upper limit frequency $fc_{-upper}=N_{min} \cdot fs_{-max}$ and a lower limit frequency $fc_{-lower}=fc_{-upper} \cdot N_{min}/(N_{min}+2)$. The carrier wave frequency fc with respect to the modulation wave frequency fs contained in this modulation wave frequency section becomes a frequency that is defined by using the number of PWM pulses $N=N_{min}$ associated in the modulation wave frequency section based on the relationship of $fc=N_{min} \cdot fs$. In the modulation wave frequency sections shown in the ranges [a, b], the range a indicates a high frequency and the range b indicates a low frequency. The same applies in the following description.

In the case of shifting the carrier wave frequency to the lower limit frequency $fc_{-lower}$, the modulation wave frequency section when $N>N_{min}$ is [$fc_{-lower}/(N-2)$, $fc_{-lower}/N$], and in the case of shifting the carrier wave frequency to the upper limit frequency $fc_{-upper}$, the modulation wave frequency section is [$fc_{-upper}/N$, $fc_{-upper}/(N+2)$]. The carrier wave frequency fc with respect to the modulation wave frequency fs contained in each of these modulation wave frequency sections is a frequency defined by using the number of PWM pulses N associated with each modulation wave frequency section based on the relationship of fc=N·fs.

(b) Relationship Between Modulation Wave Frequency fs and Number of PWM Pulses N:

(b1) Number of PWM Pulses N

FIG. 3(b) shows a relationship between the modulation wave frequency fs and the number of PWM pulses N, in which the number of PWM pulses N associated with a modulation wave frequency section on the high frequency side including the maximum frequency of the modulation wave S is set to the minimum number of PWM pulses $N_{min}$ that is a minimum even number, and values obtained by adding 2 to the minimum number of PWM pulses $N_{min}$ in order from the high frequency side to the low frequency side are set as the numbers of PWM pulses N in the respective modulation wave frequency sections. If the minimum number of PWM pulses $N_{min}$ is set to "4", values 6 and 8 and successive values are set as the numbers of PWM pulses N for the modulation wave frequency sections in order from the high frequency side to the low frequency side.

(b2) Requirement of Even Number of PWM Pulses N:

Due to the synchronism of the frequencies and the phases, the modulation wave frequency fs and the carrier wave frequency fc have the relationship expressed by fc=N·fs according to the number of PWM pulses N. The number of PWM pulses N is therefore an even number due to the requirement of symmetry of the carrier wave C with respect to the modulation wave S.

An even-multiple relationship is built up between the modulation wave frequency fs and the carrier wave frequency fc to maintain the symmetry between a corrugated shape in an anterior half and a corrugated shape in a posterior half of one period of the modulation wave S as well as the symmetry of the PWM pulses associated with the symmetry between the corrugated shapes, thereby preventing a bias of the switching loss in a specific leg of the PWM inverter in one period of the modulation wave S.

When the carrier wave frequency fc has the relationship of fc=N·fs with respect to the modulation wave frequency fs and is set to an even multiple N of the modulation wave frequency fs, where N is an even number, symmetry can be achieved between a signal waveform of the carrier wave C in an anterior half and a signal waveform of the carrier wave C in a posterior half of one period of the modulation wave frequency S.

By contrast, when the carrier wave frequency fc has a relationship of fc=(N+1)·fs with respect to the modulation wave frequency fs and is set to an odd multiple (N+1) of the modulation wave frequency fs, where N is an even number, the symmetry is not satisfied because the signal waveform of the carrier wave C in the anterior half and the signal waveform of the carrier wave C in the posterior half in the one period of the modulation wave S have an inverted relationship with respect to a time axis.

By achieving the symmetry of the carrier wave C with respect to the modulation wave S, the signal waveform of the carrier wave C in the anterior half and the signal waveform of the carrier wave C in the posterior half in the one period of the modulation wave S are symmetrical at the time point of phase n of the half period of the modulation wave S as a reference time point, thereby maintaining the symmetry of a PWM waveform of the inverter output in the anterior half period and the posterior half period.

By achieving the symmetry of the carrier wave C with the modulation wave S, the symmetry of the PWM waveforms of the inverter output in the anterior half period and the posterior half period can be maintained. The prevention of the bias of the switching loss differs depending on whether the carrier wave C is an odd function or an even function. When the carrier wave C is the odd function, a duty cycle of a gate signal in each leg is 50%, so that the switching losses in the legs are equalized to thereby prevent the bias of the switching loss. By contrast, when the carrier wave C is the even function, the duty cycle of the gate signal in each leg is not 50%, so that the switching losses in the legs are not equal and thus the bias of the switching loss cannot be prevented.

(b3) Setting of Minimum Number of PWM Pulses $N_{min}$

The minimum number of PWM pulses $N_{min}$ is selected based on the balance of increase/decrease characteristics between increase characteristics in which the switching loss increases as the minimum number of PWM pulses $N_{min}$ increases and decrease characteristics in which an amount of generated harmonics decreases as the minimum number of PWM pulses $N_{min}$ increases.

The single-phase inverter in the RF band is required to decrease the number of PWM pulses N so as to reduce the switching loss for achieving high efficiency. Since the number of PWM pulses N increases as the modulation wave frequency becomes lower, it is necessary to select the minimum number of PWM pulses $N_{min}$ such that the number of PWM pulses N at the maximum modulation wave frequency on the high frequency side becomes small. By contrast, since the amount of the generated harmonics contained in the inverter output increases as the number of PWM pulses N becomes smaller, it is necessary to select the minimum number of PWM pulses $N_{min}$ with which the number of PWM pulses N on the high frequency side increases, so as to reduce the amount of generated harmonics contained in the inverter output.

Thus, the minimum number of PWM pulses $N_{min}$ has a trade-off relationship between a digitization of the low number of pulses for reducing the switching loss and a digitization of the high number of pulses for reducing the amount of the generated harmonics, so that the minimum number of PWM pulses $N_{min}$ is selected to achieve the balance of the trade-off relationship. Furthermore, the number of PWM pulses N needs to be an even number in terms of the symmetry of the waveform.

Figure 4:
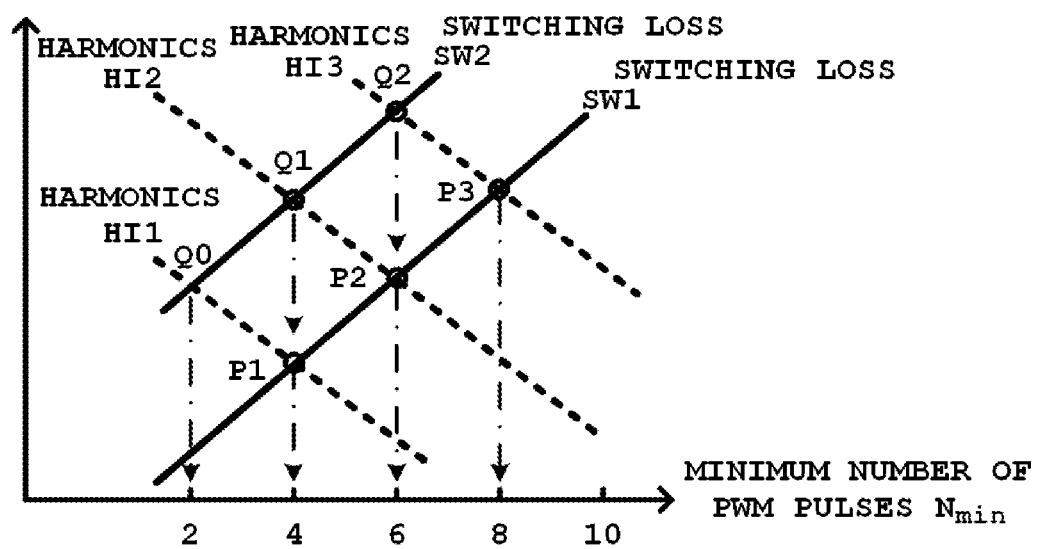
FIG. 4 is a diagram illustrating a setting of a minimum number of PWM pulses $N_{min}$.
Figure 6:
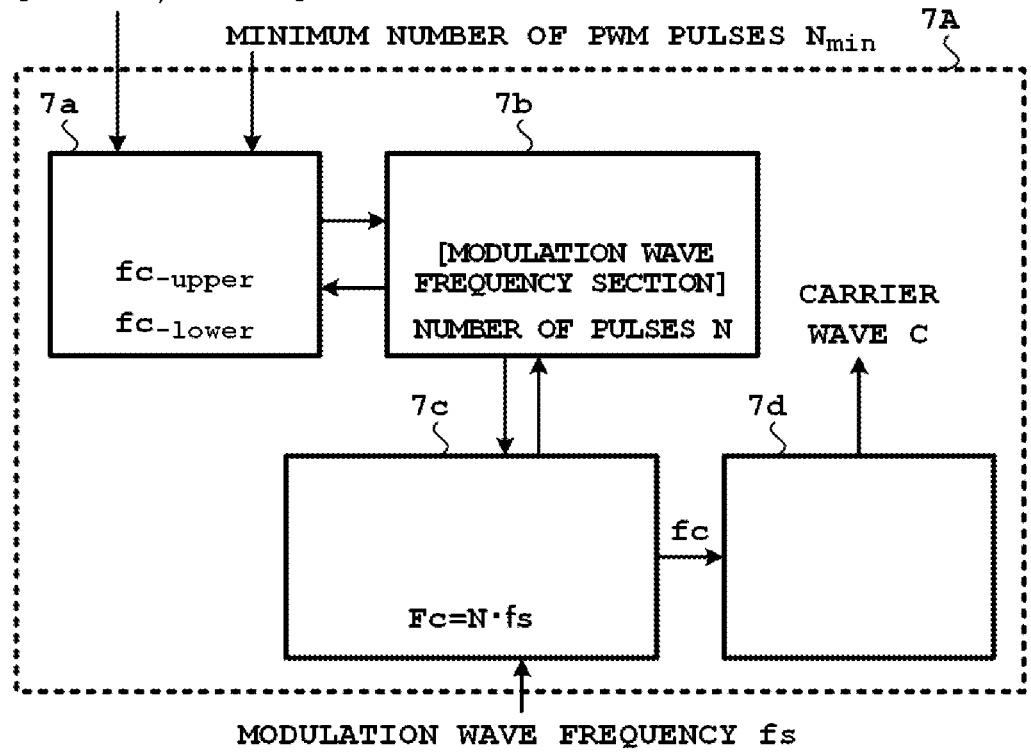
FIGS. 6(a) and 6(b) are a diagram illustrating a configuration example of a carrier wave generation unit of the present invention.
Figure 6:
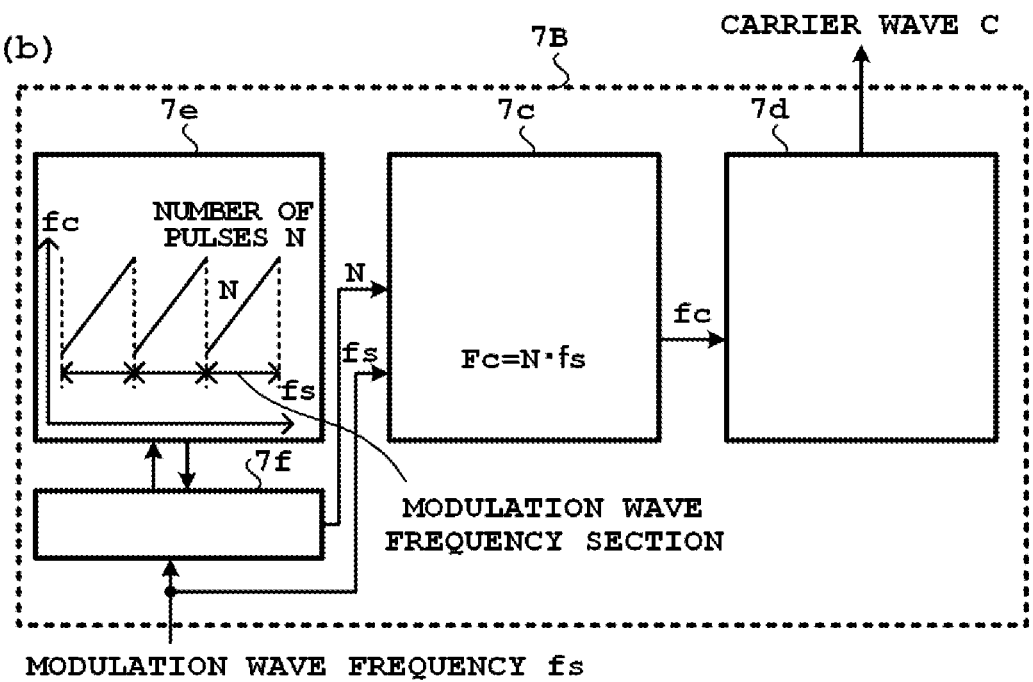

FIG. 4 illustrates an example of the selection of the minimum number of PWM pulses $N_{min}$. In FIG. 4, the lateral axis represents the minimum number of PWM pulses $N_{min}$, and the vertical axis represents the switching loss and the amount of the generated harmonics. The solid line in the figure denotes the switching loss, and the broken line denotes the amount of generated harmonics. The figure schematically shows variation characteristics of the switching loss and the amount of generated harmonics for purposes of illustration, and thus does not necessarily show actual characteristics.

The switching loss shows the increase characteristics with respect to the minimum number of PWM pulses $N_{min}$ and the amount of modulated harmonics shows the decrease characteristics with respect to the minimum number of PWM pulses $N_{min}$, and the minimum number of PWM pulses $N_{min}$ can be selected based on a point at which these characteristics intersect each other. For example, when the switching loss shows characteristics indicated by SW1 and the amount of generated harmonics shows characteristics indicated by HI1, both of the switching loss and the amount of generated harmonics become smaller at a point P1 at which these characteristics intersect each other. The minimum number of PWM pulses $N_{min}$ at the point P1 of the trade-off between the switching loss and the amount of generated harmonics is "4", and thus this value is selected as the minimum number of pulses $N_{min}$.

In the state where the switching loss shows the unchanged characteristics SW1, when the characteristics of the amount of generated harmonics changes to one denoted by HI2, a value "6" is selected for the minimum number of PWM pulses $N_{min}$ at the point of the trade-off between the switching loss and the amount of generated harmonics according to the intersection P2 of SW1 and HI2.

In the state where the amount of generated harmonics shows the unchanged characteristics HI2, when the characteristics of the switching loss changes to one denoted by SW2, a value "4" is selected for the minimum number of PWM pulses $N_{min}$ according to an intersection Q1 of HI2 and SW2.

Correspondingly, depending on the characteristics SW1, SW2 of the switching loss and the characteristics HI1, HI2, HI3 of the amount of generated harmonics, the minimum number of PWM pulses $N_{min}$ is selected according to the intersections P1, P2, P3 and the intersections Q0, Q1, Q2, which are between SW1, SW2 and HI1, HI2, HI3, respectively.

In here, for setting the minimum number of PWM pulses $N_{min}$, the values 2, 4 and 6 are used as candidates for the minimum number of PWM pulses $N_{min}$ to select the preferable minimum number of PWM pulses $N_{min}$.

(1) When the minimum even value "2" is selected for the minimum number of PWM pulses $N_{min}$, the switching loss is the lowest. However, according to the relationship of $fc_{-lower}=fc_{-upper}/2$, the variable range of the carrier wave frequency fc is maximum, and consequently the amount of harmonics is maximum. It is therefore necessary to remove the harmonics by using the largest low-pass filter during the variable frequency control on the modulation wave S.

(2) When the value "$N_{min}=6$" is selected for the minimum number of PWM pulses $N_{min}$, the switching loss increases comparing to the case of "$N_{min}=4$". However, the amount of the harmonics is low, and thus the harmonics can be removed during the variable frequency control on the modulation wave S by using a low-pass filter smaller than that used when "$N_{min}=4$".

(3) When the value "4" is selected for the minimum number of PWM pulses $N_{min}$, the resultant characteristics provides a balance between the cases of the value "2" and the value "6". Thus, when the values "2", "4" and "6" are selected as candidates for the minimum number of PWM pulses $N_{min}$, the value "4" is selected as the preferable minimum number of PWM pulses $N_{min}$.

(b4) Associating Number of PWM Pulses with Modulation Wave Frequency Section

In the relationship between the modulation wave frequency fs and the number of PWM pulses N shown in FIG. 3(b), the number of PWM pulses N is set in association with each modulation wave frequency section.

The number of PWM pulses N is set with a value obtained by adding "2" to the number of PWM pulses N in order from a modulation wave frequency section on the high frequency side to a modulation wave frequency section on the low frequency side. The number of PWM pulses N is an even integer due to the symmetry of the carrier wave, so that the number of PWM pulses N set to each modulation wave frequency section is also an even integer.

The number of PWM pulses N set to a modulation wave frequency section ($N_{min}$ section) which includes the maximum modulation wave frequency $fs_{-max}$ is the minimum number of PWM pulses $N_{min}$, and the number of PWM pulses N set to a modulation wave frequency section ($N_{max}$ section) which includes the minimum modulation wave frequency $fs_{-min}$ is the maximum number of PWM pulses $N_{max}$. These number of PWM pulses N are even integers due to the symmetry of the carrier wave.

(b5) Setting of Modulation Wave Frequency Section

According to the above-described relationship, if the number of PWM pulses N at the maximum frequency $fs_{-max}$ of the modulation wave frequency is set as the minimum number of PWM pulses $N_{min}$, there is a relationship of $fc_{-upper}=N_{min} \cdot fs_{-max}$, and $fc_{-lower}=fc_{-upper} \cdot N_{min}/(N_{min}+2)$.

When the carrier wave frequency is shifted to the lower limit frequency $fc_{-lower}$, the value of the frequency $fc_{-lower}$ is used to define the values of $fs_{-min}(N)$ and $fs_{-max}(N)$. According to the above-described relationship, a frequency section, where the modulation wave frequency fs for the number of PWM pulses N is variable when the carrier wave frequency is shifted to the lower limit frequency $fc_{-lower}$, can be expressed as below.

A section where the frequency fs is variable in a section of $N=N_{min}$:

$$fs=[fc_{-upper}/N_{min}, fc_{-lower}/N_{min}]$$

A section where the frequency fs is variable in a section of $N=N_{min}+2$:

$$fs=[fc_{-lower}/N_{min}, fc_{-lower}/(N_{min}+2)]$$

A section where the frequency fs is variable in a section of $N>N_{min}$:

$$fs=[fc_{-lower}/(N-2), fc_{-lower}/N]$$

When the carrier wave frequency is shifted to the upper limit frequency $fc_{-upper}$, the value of the frequency $fc_{-upper}$ is used to define the values of $fs_{-max}(N)$ and $fs_{-min}(N)$. According to the above-described relationship, a frequency section, where the modulation wave frequency fs for the number of PWM pulses N is variable when the carrier wave frequency is shifted to the upper limit frequency $fc_{-upper}$, can be expressed as below.

A section where the frequency fs is variable in the section of $N=N_{min}$:

$$fs=[fc_{-upper}/N_{min}, fc_{-lower}/N_{min}]$$

A section where the frequency fs is variable in the section of $N=N_{min}+2$:

$$fs=[fc_{-upper}/(N_{min}+2), fc_{-upper}/(N_{min}+4)]$$

A section where the frequency fs is variable in the section of $N>N_{min}$:

$$fs=[fc_{-upper}/N, fc_{-upper}/(N+2)]$$

Table 1 will be presented below that shows an example of the modulation wave variable frequency range according to the minimum number of PWM pulses $N_{min}$, in which the carrier wave frequency fc is limited between the lower limit frequency $fc_{-lower}$ and the upper limit frequency $fc_{-upper}$ when the carrier wave frequency is shifted to the lower limit frequency $fc_{-lower}$.

The modulation wave variable frequency ranges shown in Table 1 are examples of frequency bands corresponding to the HF band (3 MHz to 30 MHz) and the VHF band (30 MHz to 300 MHz) in a radio frequency (RF) band. These modulation wave variable frequency ranges are some examples and are not limited thereto.

TABLE 1

| Number of PWM Pulses N | Modulation Wave Frequency Section | Carrier Wave Frequency Section |
| --- | --- | --- |
| N = 4 | 13.56 MHz ≥ fs ≥ 9.04 MHz | 54.24 MHz ≥ fc ≥ 36.16 MHz |
| N = 6 | 9.04 MHz ≥ fs ≥ 6.03 MHz | 54.24 MHz ≥ fc ≥ 36.18 MHz |
| N = 8 | 6.03 MHz ≥ fs ≥ 4.52 MHz | 48.24 MHz ≥ fc ≥ 36.16 MHz |
| N = 10 | 4.52 MHz ≥ fs ≥ 3.62 MHz | 45.20 MHz ≥ fc ≥ 36.20 MHz |
| N = 12 | 3.62 MHz ≥ fs ≥ 3.02 MHz | 43.44 MHz ≥ fc ≥ 36.24 MHz |
| N = 14 | 3.02 MHz ≥ fs ≥ 2.59 MHz | 42.28 MHz ≥ fc ≥ 36.26 MHz |

Each modulation wave frequency section is associated with the number of PWM pulses N, so as to maintain the relationship of $fc=N \cdot fs$.

The modulation wave frequency section in a frequency range of 13.56 MHz≥fs≥9.04 MHz is associated with the number of PWM pulses N of "4", and the modulation wave frequency section in a frequency range of 3.02 MHz≥fs≥2.59 MHz is associated with the number of PWM pulses N of "14". Thus, the number of PWM pulses N is changed based on the modulation wave frequency fs.

(b5) Number of PWM Pulses N in Each Modulation Wave Frequency Section (1) The number of PWM pulses N associated with a modulation wave frequency section on the highest frequency side including the maximum frequency of the modulation wave S is the minimum number of PWM pulses $N_{min}$ having the smallest even value.

(2) The numbers of PWM pulses N associated with a modulation wave frequency section on the low frequency side are the values obtained by adding 2 to the minimum number of PWM pulses $N_{min}$ in order from the high frequency side to the low frequency side.

The number of PWM pulses N in each modulation wave frequency section is set in such a manner that the minimum number of PWM pulses $N_{min}$ is set for the modulation wave frequency section on the high frequency side and then the value "2" is added to the minimum number of PWM pulses $N_{min}$ in order towards the modulation wave frequency section on the low frequency side.

When the minimum number of PWM pulses $N_{min}$ is set to 4, the values of 6 and 8 and subsequent values are set as the number of PWM pulses N for each modulation wave frequency section in order from the high frequency side to the low frequency side.

By setting the small number of PWM pulses N for the modulation wave frequency section on the high frequency side while setting the large number of PWM pulses N for the modulation wave frequency section on the low frequency side, the carrier frequency fc in each modulation wave frequency section can be held within the carrier wave variable frequency range included between the upper and lower limit frequencies of the carrier wave based on the relationship of fc=N·fs.

(c) Relationship Between Modulation Wave Frequency fs and Switching Loss:

The switching loss Loss is based on the number of switching $n_{sw}$ performed per unit time of the number of PWM pulses N. Thus, the switching loss Loss can be evaluated based on a product ($n_{sw}$=N·fs) of the number of PWM pulses N and the modulation wave frequency fs.

(B) Phase Synchronism in Wide Band

In the present invention, the carrier wave C has an odd function or an even function with respect to the modulation wave S to ensure the symmetry of the waveform of the carrier wave C with respect to the reference point in one period of the modulation wave S, thereby maintaining the symmetry of a PWM waveform of the inverter output between an anterior half period and a posterior half period.

(a) Waveform Characteristics of Carrier Wave

The carrier wave has a shape representing an odd function or an even function. The odd function satisfies f(x)=−f(−x) for a given value of x, and is symmetrical about a point with respect to x=0 at the reference time point. The waveform representing the odd function includes a sinusoidal waveform and a triangular waveform, by way of example.

By contrast, the even function satisfies f(x)=f(−x) for the given value x, and is symmetrical about points of time before and after x=0 at the reference time point.

By making the shape of the carrier wave to represent the odd function or the even function, the carrier wave C can have the symmetrical waveform with respect to that of the modulation wave S. Then, the carrier wave C having the symmetry is used in a bridge circuit forming the PWM inverter so that a PWM voltage of the inverter output, which changes every half period, has a symmetrical waveform.

FIG. 5(a) shows a case where the carrier wave is the odd function with respect to the modulation wave S, and FIG. 5(b) shows a case where the carrier wave is the even function with respect to the modulation wave S. These figures show the modulation waves S indicated by a solid line and a dashed-dotted line, respectively, with their phases being inversed by 180 degrees and the carrier wave C indicated by a broken line. In here, the number of PWM pulses N is 2.

The PWM pulse is generated by comparing the modulation wave S with the carrier wave C. FIGS. 5(a) and 5(b) show gates signals for switching elements Q1 to Q4 of the bridge circuit included in the PWM inverter. The relationships between switching elements Q1 and Q3 and between the switching elements Q2 and Q4 are to conduct two legs of the bridge circuit in opposite phases to each other.

In the case of the odd function shown in FIG. 5(a), comparing the gate signal of the switching element Q1 with the gate signal of the switching element Q3, the waveforms are symmetrical with each other with respect to n that is a half period of the modulation wave S. The gate signal of the switching element Q1 has an inversion relationship with the gate signal of the switching element Q2 and the gate signal of the switching element Q3 has an inversion relationship with the gate signal of the switching element Q4, so that the waveform of the gate signal of the switching element Q2 is also symmetrical with the waveform of the gate signal of the switching element Q4 with respect to the half period n of the modulation wave S. This waveform symmetry achieves symmetry between the signal waveform of the carrier wave C in the anterior half and the signal waveform of the carrier wave C in the posterior half in one period of the modulation wave S at the time point of phase n of the half period of the modulation wave S as the reference time point, thereby synchronizing the phases between both waveforms.

Achievement of the symmetry in the carrier wave C with respect to the modulation wave S can maintain the symmetry in the PWM waveforms of the inverter output in the anterior half period and the posterior half period. In this symmetry, the switching loss equality in the case where the carrier wave C is the odd function is different from that in the case where the carrier wave C is the even function.

When the carrier wave C is the odd function, the duty cycle of the gate signal in each leg is 50%, and thus the switching losses in the legs are equalized so that the bias of the switching loss can be prevented. When the carrier wave C is the even function, the duty cycle of the gate signal of each leg is not 50%, and thus the switching losses in the legs are not equal and the bias of the switching loss is not prevented.

The variable frequency control according to the invention does not maintain the carrier wave frequency fc to a constant value but changes the number of PWM pulses N to vary the carrier wave frequency fc defined by the upper limit frequency and the lower limit frequency of the variation range and the modulation wave frequency fs while maintaining the odd function or the even function with the relationship of fc=N·fs between the waves fc and fs being maintained, thereby reducing the switching loss and the amount of generated harmonics. Furthermore, the carrier wave C is made to be the odd function so that the switching losses in the legs of the bridge circuit are equalized to prevent the bias of the switching loss.

(C) Configuration Example of Carrier Wave Generation Unit

A configuration example of the carrier wave generation unit will be described by referring to FIGS. 6(a) and 6(b).

(1) Configuration Example 1

Configuration Example 1 shown in FIG. 6(a) includes a carrier wave upper and lower limit frequency setting unit 7a, a modulation wave frequency section setting unit 7b, a carrier wave frequency computation unit 7c and a carrier wave output unit 7d.

The carrier wave upper and lower limit frequency setting unit 7a is configured to set an upper limit frequency $fc_{\_upper}$ and a lower limit frequency $fc_{\_lower}$ of a carrier wave based on a range $[fs_{\_max}, fs_{\_min}]$ of a modulation wave frequency fs and the minimum number of PWM pulses $N_{min}$.

The modulation wave frequency section setting unit 7b is configured to divide the whole range of the modulation wave frequency fs into a plurality of modulation wave frequency sections based on the upper limit frequency $fc_{\_upper}$ and the lower limit frequency $fc_{\_lower}$ of the carrier wave as well as the number of PWM pulses N, and further associates the number of PWM pulses N with each modulation wave frequency section, so as to set the obtained sections and the associated number of PWM pulses as characteristic data. In here, the minimum number of PWM pulses $N_{min}$ is associated with a modulation wave frequency section in which the modulation wave frequency including the maximum frequency of the modulation wave S is the highest, and the number of PWM pulses N obtained by adding "2" to the number $N_{min}$ in descending order of modulation wave frequency fs is associated with a modulation wave frequency section in which the modulation wave frequency is low.

The carrier wave frequency computation unit 7c is configured to compute a carrier wave frequency fc with respect to the modulation wave frequency fs according to the relationship of fc=N·fs based on the characteristic data set by the modulation wave frequency section setting unit 7b.

The carrier wave output unit 7d is configured to output the carrier wave C at the carrier wave frequency fc computed by the carrier wave frequency computation unit 7c.

(2) Configuration Example 2

Configuration Example 2 shown in FIG. 6(b) includes a characteristic data storage unit 7e, a reading unit 7f, the carrier wave frequency computation unit 7c and the carrier wave output unit 7d.

The characteristic data storage unit 7e is configured to store the characteristic data about the modulation wave frequency sections set by the modulation wave frequency section setting unit 7b and the number of PWM pulses N associated with each modulation wave frequency section. The reading unit 7f is configured to input the modulation wave frequency fs and read the characteristic data about a modulation wave frequency section that includes the concerned modulation wave frequency fs and the number of PWM pulses N associated with the concerned section from the characteristic data storage unit 7e. For example, memory for the characteristic data in the characteristic data storage unit 7e can store the modulation wave frequency section and the number of PWM pulses N in a tabular form, as well as in an arbitrary form.

The carrier wave frequency computation unit 7c computes the carrier wave frequency fc with respect to the modulation wave frequency fs according to the relationship of fc=N·fs based on the characteristic data read from the characteristic data storage unit 7e, and the carrier wave output unit 7d outputs the carrier wave C at the carrier wave frequency fc computed by the carrier wave frequency computation unit 7c.

According to Configuration Example 2, pieces of preset characteristic data can be stored in the characteristic data storage unit 7e, and a piece of characteristic data that corresponds to the change in the modulation wave frequency fs can be read out. Thus, the computation processing for setting characteristic data can be shortened.

(D) Operational Example in Configuration Example of Wideband RF Power Supply

Figure 7:
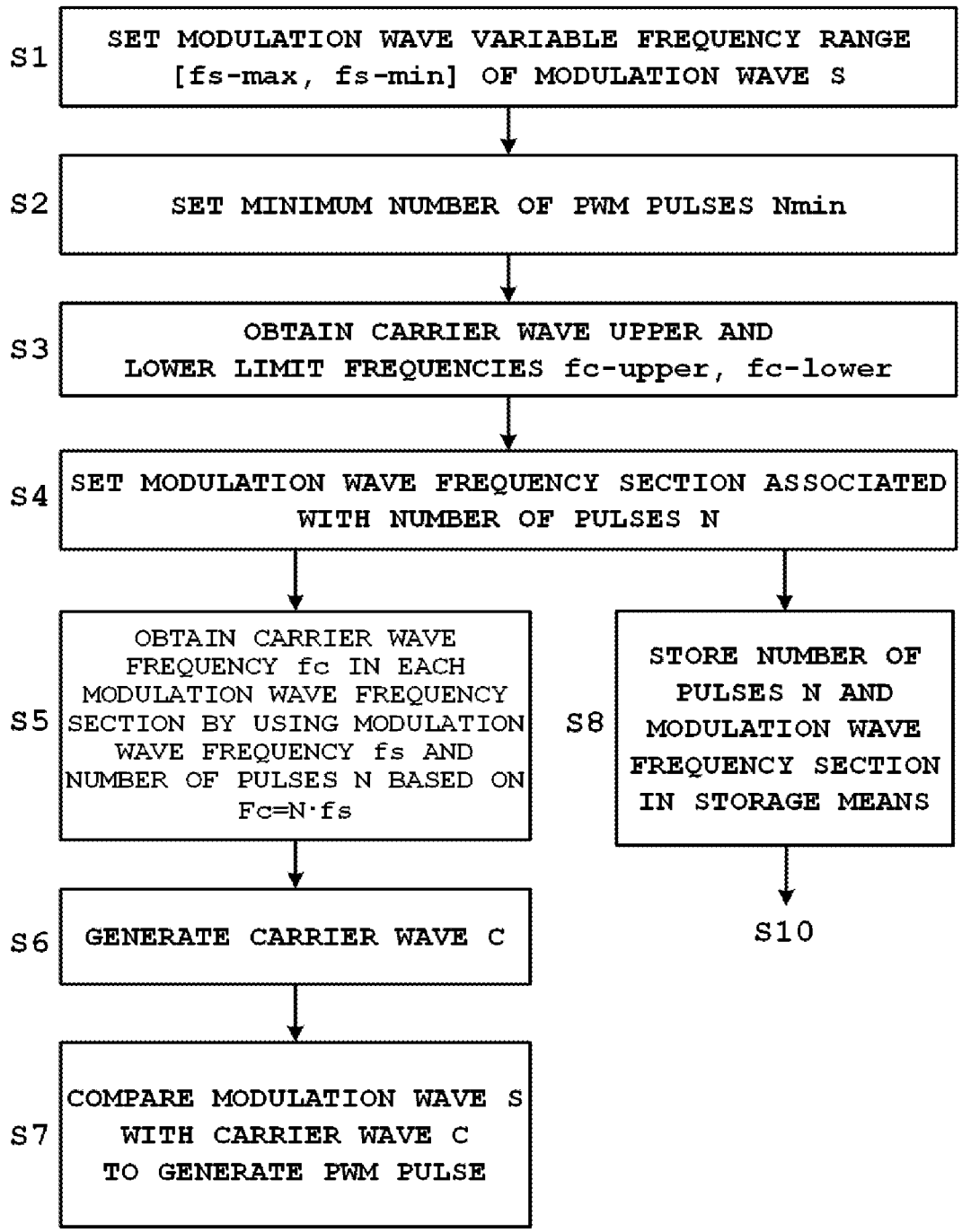
FIG. 7 is a flowchart illustrating an operational example of Configuration Example 1 of the wideband RF power supply of the present invention.
Figure 8:
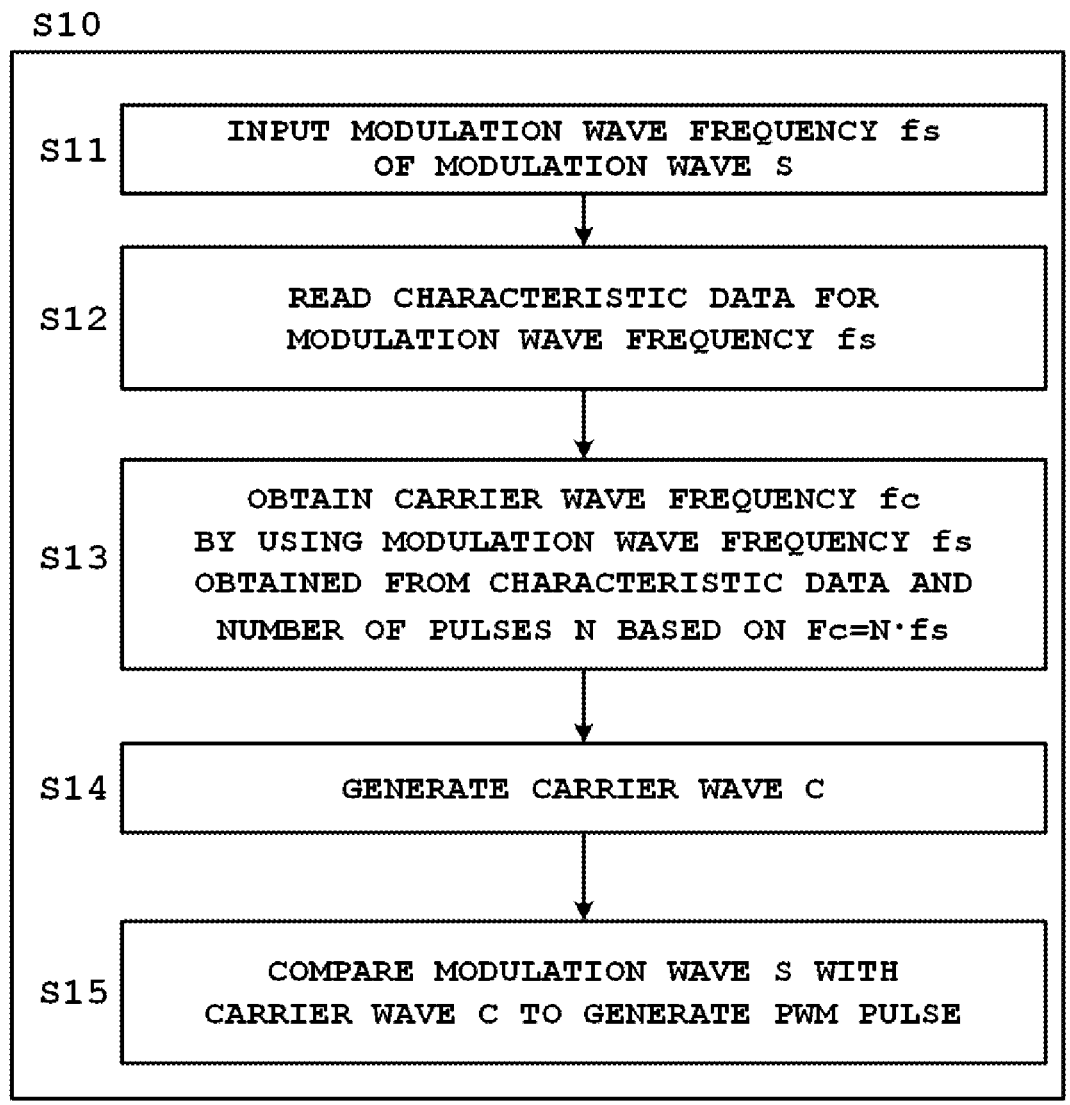
FIG. 8 is a flowchart illustrating an operational example of Configuration Example 2 of the wideband RF power supply of the present invention.
Figure 9:
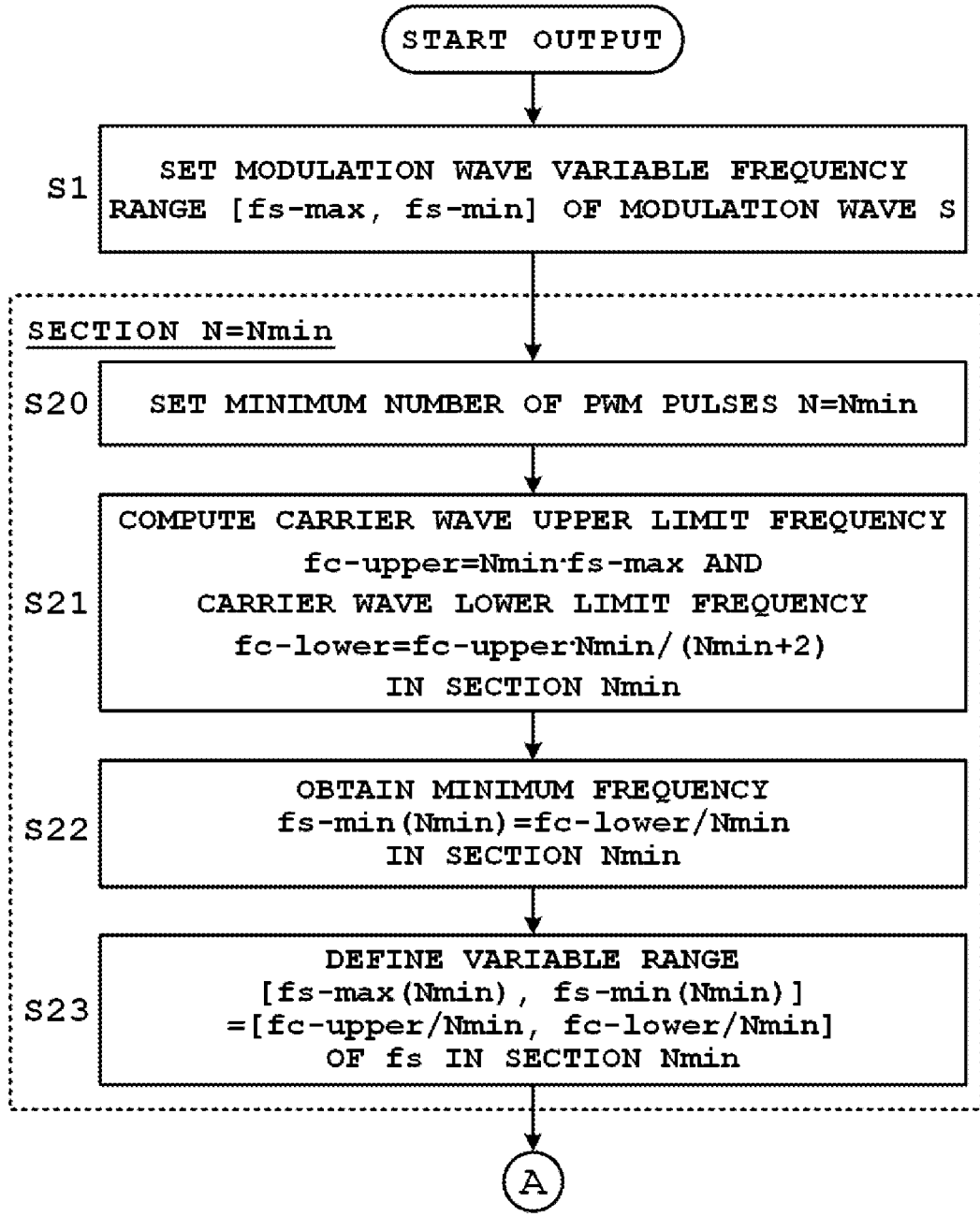
FIG. 9 is a flowchart illustrating in detail steps of S1 to S7 in the wideband RF power supply of the invention shown in FIG. 7.
Figure 10:
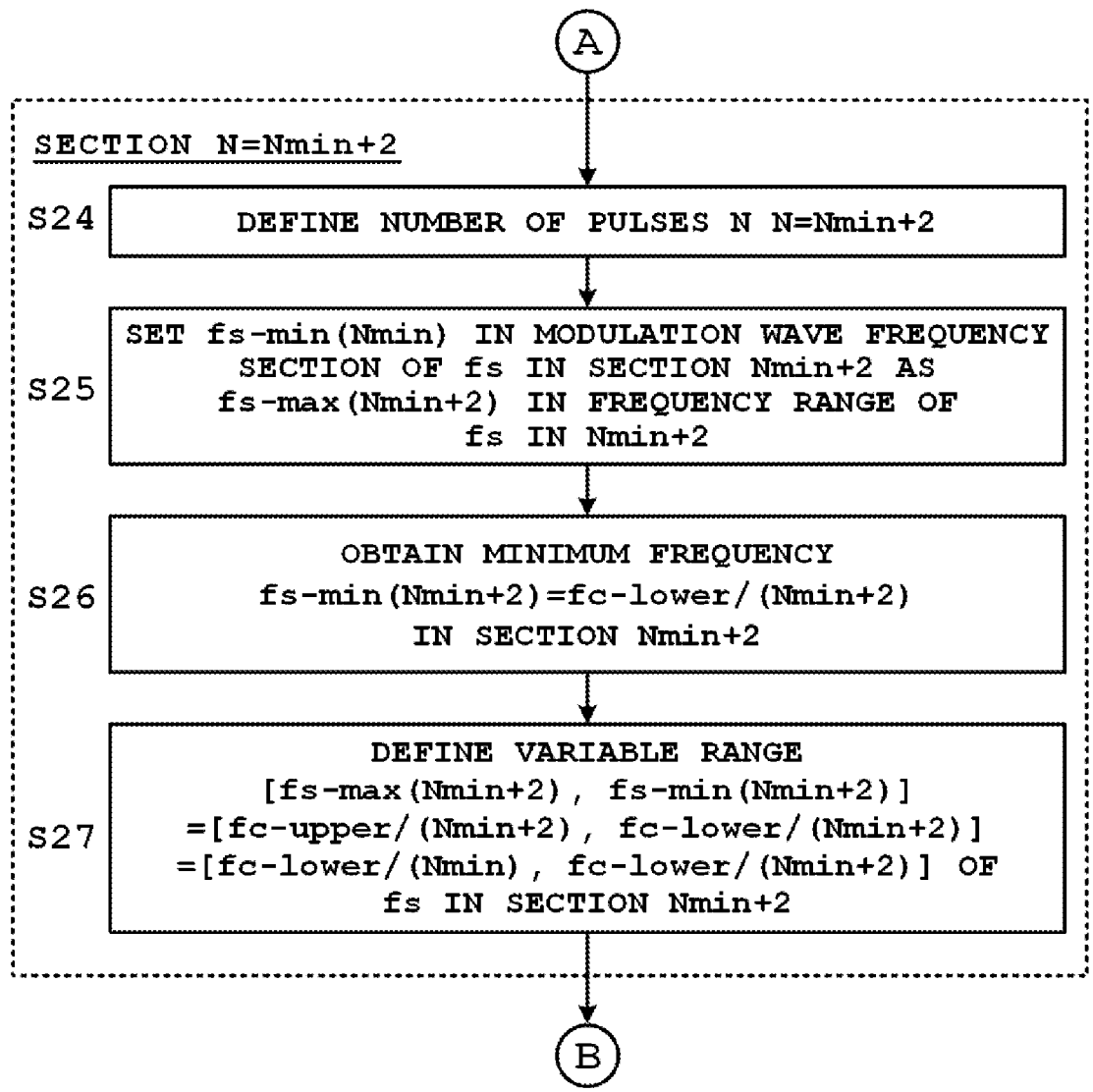
FIG. 10 is a flowchart illustrating in detail the steps of S1 to S7 in the wideband RF power supply of the invention shown in FIG. 7.
Figure 11:
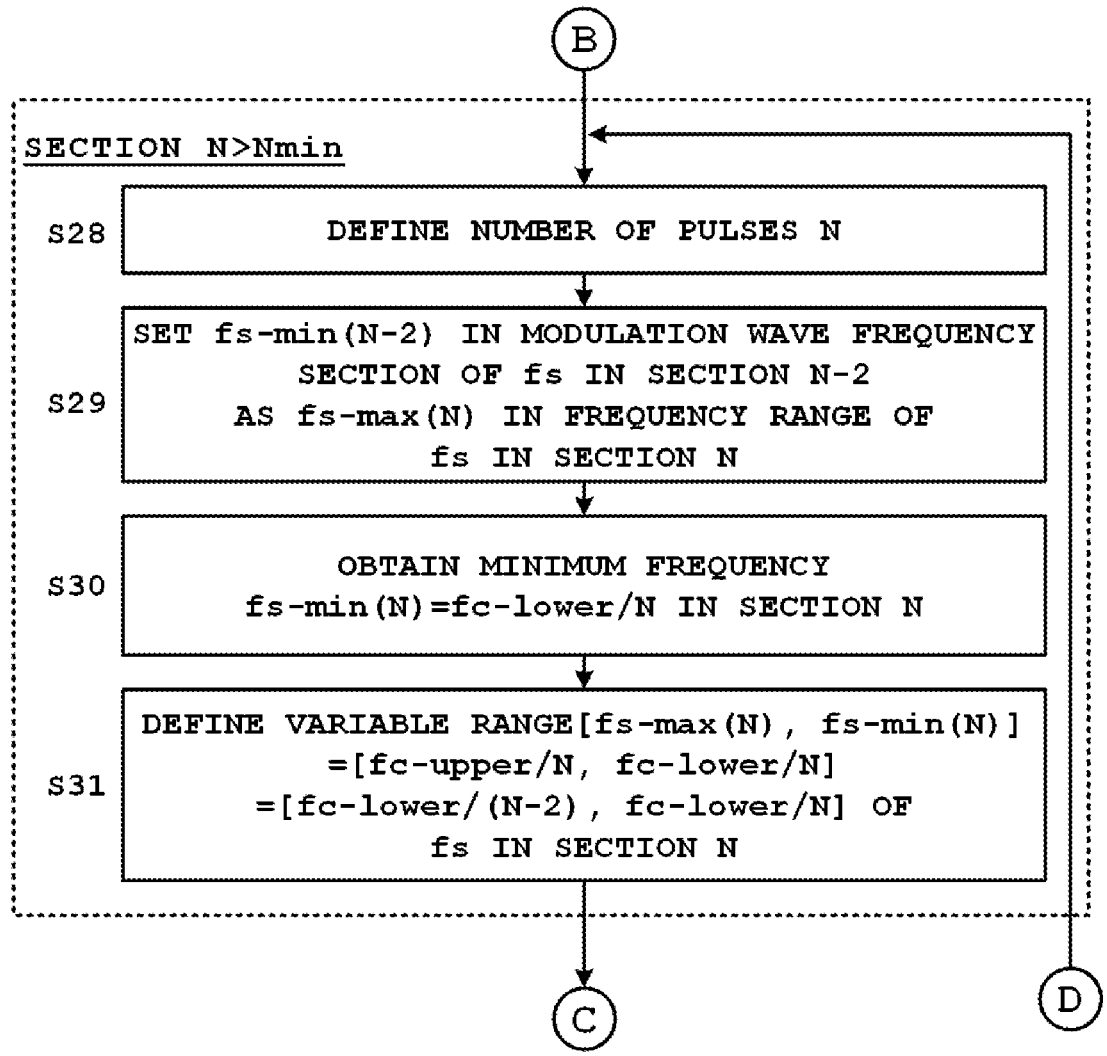
FIG. 11 is a flowchart illustrating in detail the steps of S1 to S7 in the wideband RF power supply of the invention shown in FIG. 7.
Figure 12:
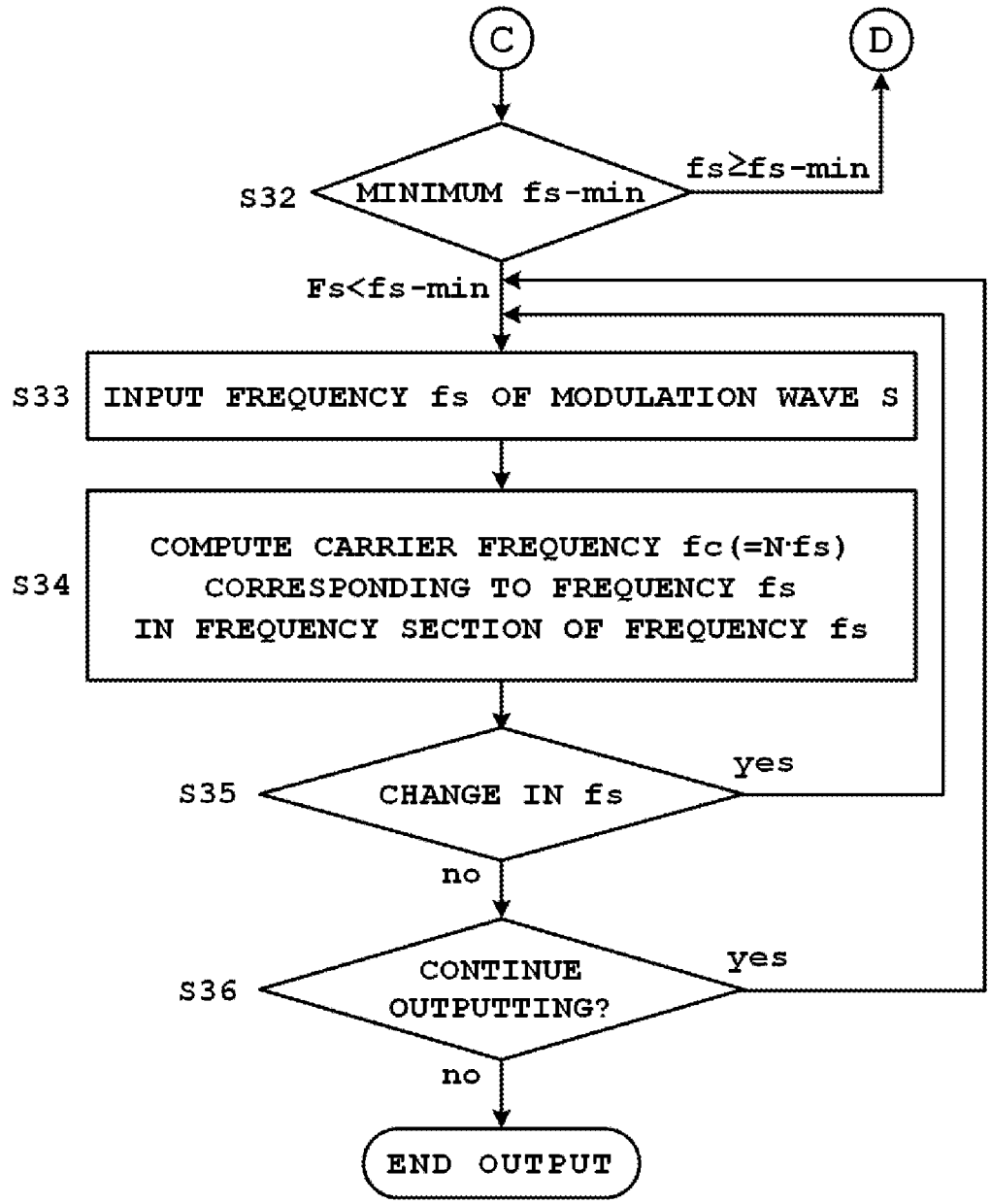
FIG. 12 is a flowchart illustrating in detail the steps of S1 to S7 in the wideband RF power supply of the invention shown in FIG. 7.

A description will be made about an operational example in the configuration examples of the wideband RF power supply by referring to FIGS. 7 to 12. FIG. 7 is a flowchart illustrating an operational example of configuration Example 1, and FIG. 8 is a flowchart illustrating an operational example of configuration Example 2. Furthermore, FIGS. 9 to 12 are flowcharts illustrating in detail the steps of S1 to S7 shown in FIG. 7. In the flowcharts, a letter symbol S represents a sequence of the operation.

(1) Operational Example of Configuration Example 1

The flowchart in FIG. 7 shows an operational example of Configuration Example 1.

(S1) The modulation wave variable frequency ranges $[fs_{\_max}, fs_{\_min}]$ of the modulation wave S are set. The minimum frequency $fs_{\_min}$ and the maximum frequency $fs_{\_max}$ of the modulation wave S are set based on a frequency range of a sine wave with a fundamental component output by the wideband RF power supply. This setting is merely an example, and a modulation wave variable frequency range may be set based on another criterion.

(S2) The minimum number of PWM pulses $N_{min}$ is selected based on a balance in increase/decrease characteristics between increase characteristics in which the switching loss increases as the minimum number of PWM pulses $N_{min}$ increases and decrease characteristics in which an amount of generated harmonics decreases as the minimum number of PWM pulses $N_{min}$ increases.

As indicated in the paragraph about the setting of the number $N_{min}$, from the relationship fc=N·fs, the number of PWM pulses N decreases as the modulation wave frequency fs increases, whereas a switching loss Loss increases as the number of PWM pulses N increases. Due to the increase characteristics in which the switching loss increases as the minimum number of PWM pulses $N_{min}$ increases, the number of PWM pulses N needs to be small in order to reduce the switching loss Loss.

In regard to the amount of generated harmonics, the amount of generated harmonics decreases as the number of PWM pulses N increases. Due to the decrease characteristics in which the amount of generated harmonics decreases as the minimum number of PWM pulses $N_{min}$ increases, the number of PWM pulses N needs to be large in order to reduce the amount of generated harmonics.

(S3) The upper limit frequency $fc_{\_upper}$ and the lower limit frequency $fc_{\_lower}$ of the carrier wave are obtained. As indicated in the paragraph about the setting of the upper and lower limit frequencies of the carrier wave, the upper limit frequency $fc_{\_upper}$ of the carrier wave is set by a product of the minimum number of PWM pulses $N_{min}$ in the modulation wave frequency section including the maximum modulation wave frequency $fs_{\_max}$ and the maximum frequency $fs_{\_max}$, and the lower limit frequency $fc_{\_lower}$ is set by a product of the upper limit frequency $fc_{\_upper}$ of the carrier wave and $(N_{min}/(N_{min}+2))$.

On the basis of the maximum frequency $fs_{\_max}$ of the modulation wave S set in Step S1 and the minimum number of PWM pulses $N_{min}$ set in Step S2, the upper limit frequency $fc_{\_upper}$ in the modulation wave variable frequency range including the maximum maximum-minimum frequency $fs_{\_max}$ is set by $(N_{min} \cdot fs_{\_max})$.

On the other hand, the lower limit frequency $fc_{\_lower}$ is set by $fc_{\_upper} \cdot (N_{min}/(N_{min}+2))$. Thus, the carrier wave variable frequency range in the modulation wave variable frequency range including the maximum frequency $fs_{-max}$ is $[fc_{-upper}, fc_{-lower}] = [N_{min} \cdot fs_{-max}, fc_{-upper} \cdot (N_{min}/(N_{min}+2))]$.

(S4) A modulation wave frequency section associated with the number of PWM pulses N is set.

As indicated in the paragraph about the setting of the modulation wave frequency section, a frequency section in which the modulation wave frequency fs with respect to the number of PWM pulses N is variable is set. This paragraph shows an example when the carrier wave frequency is shifted to the lower limit frequency $fc_{-lower}$.

A section where the frequency fs is variable in a section of $N=N_{min}$:

$$fs = [fc_{-upper}/N_{min}, fc_{-lower}/N_{min}]$$

A section where the frequency fs is variable in a section of $N=N_{min}+2$:

$$fs = [fc_{-lower}/N_{min}, fc_{-lower}/(N_{min}+2)]$$

A section where the frequency fs is variable in a section of $N>N_{min}$:

$$fs = [fc_{-lower}/(N-2), fc_{-lower}/N]$$

(S5) The carrier wave frequency fc is obtained by using the modulation wave frequency fs and the number of PWM pulses N in each modulation wave frequency section according to the relationship of $fc = N \cdot fs$. From this relationship, the number of PWM pulses N is changed according to a modulation wave frequency section that includes the modulation wave frequency fs whose frequency changes, so as to obtain the carrier wave frequency fc based on the modulation wave frequency fs and the number of PWM pulses N.

(S6) The carrier wave C at the carrier wave frequency fc obtained in Step S5 is generated.

(S7) The modulation wave S is compared with the carrier wave C to generate a PWM pulse.

Steps (S5) to (S7) are for generating the carrier wave C at the carrier wave frequency fc to be input each time the modulation wave frequency fs is input, so as to generate the PWM pulse.

By contrast, Step (S8) is for storing the modulation wave frequency section set in Step S4 and the number of PWM pulses N associated with the modulation wave frequency section as characteristic data in storage means, and then in Step S10, reading the characteristic data for the input modulation wave frequency fs to thereby generate the PWM pulse.

(2) Operational Example in Configuration Example 1

A process in Step S10 will now be described by referring to the flowchart in FIG. 8.

(S11) The modulation wave frequency fs of the modulation wave S is input. The modulation wave frequency fs to be input shall be within the modulation wave variable frequency range.

(S12) The characteristic data stored in the storage means is read out.

(S13) On the basis of the characteristic data read out, then, the number of PWM pulses N that corresponds to the input modulation wave frequency fs is read out to thereby obtain the carrier wave frequency fc according to the relationship of $fc = N \cdot fs$.

(S14) The carrier wave C at the carrier wave frequency fc obtained in Step S13 is generated.

(S15) The carrier wave C generated in Step S14 is compared with the modulation wave S to generate a PWM pulse to be used in the PWM inverter.

(3) Detailed Operational Example of Configuration Example 1

Operational examples in the section $N=N_{min}$, the section $N=N_{min}+2$ and a section $N=N_{min}$ in Steps (S1) to (S7) will be described based on the flowcharts in FIGS. 9 to 12.

(S1) The modulation wave variable frequency range $[fs_{-max}, fs_{-min}]$ of the modulation wave S is set. The maximum frequency $fs_{-max}$ and the minimum frequency $fs_{-min}$ of the modulation wave S are set based on a frequency range of a sine wave output by the wideband RF power supply.

[Section $N=N_{min}$]

(S20) The minimum number of PWM pulses $N_{min}$ is set.

(S21) In the section $N_{min}$ an upper limit frequency $fc_{-upper} = N_{min} \cdot fs_{-max}$ of the carrier wave and a lower limit frequency $fc_{-lower} = fc_{-upper}(N_{min}/(N_{min}+2))$ of the carrier wave are computed.

(S22) A minimum frequency $fs_{-min}(N_{min}) = fc_{-lower}/N_{min}$ in the section $N_{min}$ is obtained.

(S23) A variable range $[fs_{-max}(N_{min}), fs_{-min}(N_{min})] = [fc_{-upper}/N_{min}, fc_{-lower}/N_{min}]$ of the modulation wave frequency fs in the section $N_{min}$ is obtained.

[Section $N=N_{min}+2$]:

(S24) The number of PWM pulses $N_{min}+2$ is set.

(S25) A minimum frequency $fs_{-min}(N_{min})$ in a modulation wave frequency section corresponding to the section $N_{min}$ of the modulation wave frequency fs is set as a maximum frequency $fs_{-max}(N_{min}+2) = fc_{-lower}/N_{min}$ corresponding to the section $N_{min}+2$.

(S26) A minimum frequency $fs_{-min}(N_{min}+2) = fc_{-lower}/(N_{min}+2)$ in the section $N_{min}+2$ is obtained.

(S27) A variable range $[fs_{-max}(N_{min}+2), fs_{-min}(N_{min}+2)] = [fc_{-lower}/N_{min}, fc_{-lower}/(N_{min}+2)]$ of the modulation wave frequency fs in the section $N_{min}+2$ is obtained.

[Section $N>N_{min}$]

(S28) The number of PWM pulses N is set.

(S29) A minimum frequency $fs_{-min}(N-2)$ in a modulation wave frequency section corresponding to a section $N-2$ of the modulation wave frequency fs is set as a maximum frequency $fs_{-max}(N) = fc_{-lower}/(N-2)$ in a modulation wave frequency section corresponding to the section N.

(S30) A minimum frequency $fs_{-min}(N) = fc_{-lower}/N$ in the section N is obtained.

(S31) A variable range $[fs_{-max}(N), fs_{-min}(N)] = [fc_{-lower}/(N-2), fc_{-lower}/N]$ of the modulation wave frequency fs in the section N is obtained.

[Section $N=N_{max}$]

(S32) A determination is made about whether the frequency becomes the minimum frequency $fs_{-min}$ due to the decrease in the modulation wave frequency fs of the modulation wave S. If the modulation wave frequency fs is equal to or larger than the minimum frequency $fs_{-min}$, Steps S28 to S31 will be repeated. If the modulation wave frequency fs is smaller than the minimum frequency $fs_{-min}$, it is determined that the modulation wave frequency fs is out of the modulation wave variable frequency range, and thus the setting in the modulation wave frequency section is terminated.

(S33) When the setting in the modulation wave frequency section is terminated, the modulation wave frequency fs of the modulation wave S that corresponds to a sine wave having a fundamental component output from the wideband RF power supply is input.

(S34) In the modulation wave frequency section of the modulation wave frequency fs, the carrier wave frequency fc of the carrier wave C that corresponds to the input modulation wave frequency fs is computed.

(S35) When the modulation wave frequency fs to be input is changed, Steps S33 and S34 are repeated to compute the carrier wave frequency fc.

(S36) When the sine wave having the fundamental component is continuously output from the wideband RF power supply, the procedure goes back to Step S33, and when terminating the continuation of output, the outputting of the sine wave from the wideband RF power supply is terminated.

(Switching Loss)

A description will now be made about the switching loss in the PWM inverter and the prevention of the switching loss by the wideband RF power supply of the present invention.

The carrier wave C and the modulation wave S have the relationship of fc=N·fs between the carrier wave frequency fc, the modulation wave frequency fs and the number N. FIG. 13 shows an example when the carrier wave is a triangular wave and the numbers of PWM pulses N are 4 and 6.

FIG. 13(a) shows periods in unit time of the modulation wave S and the carrier wave C, in which the periods are one and four, respectively, and the number of PWM pulses N in one period of the modulation wave S is "4". In addition to that, the number of pulses of the carrier wave C per unit time is 4·fs, and thus the carrier wave frequency fc is 4·fs.

FIG. 13(b) shows periods in unit time of the modulation wave S and the carrier wave C, in which the periods are one and six, respectively, and the number of PWM pulses N in one period of the modulation wave S is "6". In addition to that, the carrier wave frequency fc is 6·fs, and thus the number of pulses of the carrier wave C per unit time is 6·fs.

A single-phase PWM inverter, which performs an ON/OFF operation by switching, performs ON/OFF switching operation of a switching element by PWM control to output an alternating waveform. In the single-phase PWM inverter, the ON/OFF switching operation of the switching element causes delays in voltage transition and current transition at the time of switching between ON and OFF. The delays in the voltage and current transitions produce a period of time during which a voltage and a current remain in a switching element, resulting in power loss which is called switching loss. The switching loss has characteristics that depends on a switching frequency representing a repetition of the ON/OFF switching per unit time. Thus, the higher the switching frequency, the greater the switching loss. In the single-phase PWM inverter, a switching frequency is a carrier wave frequency, and consequently the switching loss in the single-phase PWM inverter outputting a sine wave having a fundamental component is larger than the switching loss in a square-wave inverter, which outputs a square wave, by the ratio between their switching frequencies.

Thus, in an RF band operation for outputting a sine wave having a fundamental component in the RF band, when the single-phase PWM inverter is operated in an RF band, the switching loss occurring in the switching operation becomes excessively large.

The wideband RF power supply of the present invention sets the upper limit of the carrier wave frequency fc to the upper limit frequency $fc_{-upper}$ while setting the lower limit of the frequency fc to the lower limit frequency $fc_{-lower}$, so as to limit the carrier wave variable frequency range of the carrier wave frequency fc. By changing the number of PWM pulses N as the modulation wave frequency fs changes within the modulation wave variable frequency range, the range of the carrier wave frequency fc defined based on the relationship of fc=N·fs is limited to be within the carrier wave variable frequency range of the carrier wave frequency fc.

The switching loss Loss is based on the number of switching $n_{sw}$ performed per unit time of the number of PWM pulses N, and can be evaluated based on a product ($n_{sw}$=N·fs) of the number of PWM pulses N and the modulation wave frequency fs. Accordingly, the switching loss is dependent on the number of pulses in one period of the modulation wave or the carrier wave frequency fc in unit time, so that the number of PWM pulses N and the carrier wave frequency fc are limited while changing the number of PWM pulses N to prevent the switching loss.

FIGS. 14(a) to 14(c) show the cases where the number of PWM pulses N is unchanged in the relationship of fc=N·fs.

Regardless of changes in the modulation wave frequency fs, when the number of PWM pulses N is a constant value $N_{const}$ (FIG. 14(a)), the carrier wave frequency fc increases linearly based on the relationship of fc=$N_{const}$·fs as the modulation wave frequency fs changes (FIG. 14(b)).

The switching loss Loss has positive increase characteristics for the modulation wave frequency fs as well as for the carrier wave frequency fc. Thus, the switching loss increases as the modulation wave frequency fs changes (FIG. 4(c)), and becomes larger with higher modulation wave frequency fs, so that the switching loss may exceed its upper limit.

FIGS. 14(d) to 14(f) show examples for limiting the carrier frequency fc in the frequency range between the upper limit frequency $fc_{-upper}$ and the lower limit frequency $fc_{-lower}$ by changing the number of PWM pulses N in the relationship of fc=N·fs.

The number of PWM pulses N is changed between the minimum number of PWM pulses $N_{min}$ and the maximum number of PWM pulses $N_{max}$ as the modulation wave frequency fs changes (FIG. 14(d)). The carrier wave frequency fc of the carrier C is variable based on the relationship of fc=N·fs within the frequency range between the upper limit frequency $fc_{-upper}$ and the lower limit frequency $fc_{-lower}$ in association with the number of PWM pulses N to be changed. The modulation wave frequency fs then varies within the modulation wave frequency section that associated with the number of PWM pulses N.

The switching loss Loss has positive increase characteristics for the modulation wave frequency fs as well as for the carrier wave frequency fc, and increase as the modulation wave frequency fs changes. However, since the carrier wave frequency is limited to the upper limit frequency $fc_{-upper}$ as the number of PWM pulses N changes (FIG. 14(e)), the switching loss Loss is suppressed (FIG. 14(f)).

(Cutoff Frequency of Low-Pass Filter)

The low-pass filter removes a harmonic component contained in an inverter output, so as to output a sine wave having a fundamental component. A cutoff frequency of the low-pass filter is the frequency that passes a sine wave frequency on a low frequency side while cutting off a harmonic frequency on a high frequency side. The harmonic frequency is expressed by a product (n·fs) of a harmonic order n and the modulation wave frequency fs.

Between the number of PWM pulses N and the harmonic order n of the modulation wave S generated by the single-phase PWM inverter, the harmonic is generated from a low order when the modulation wave frequency fs is high and the number of PWM pulses N is small, whereas the harmonic is generated in a high order when the modulation wave frequency fs is low and the number of PWM pulses N is large.

In the low-pass filter, the cutoff frequency is required to be a low frequency that is lower than a harmonic at the lowest frequency in order to remove the harmonic component and output the sine wave having the fundamental component. Thus, either lower of the following frequencies is set as a cutoff frequency of the low-pass filter: a frequency that cuts off the harmonic frequency in the low order for the high modulation wave frequency fs; or a frequency that cuts off the harmonic frequency in the high order for the low modulation wave frequency fs.

A minimum modulation wave frequency $fs_{-min}$ in a modulation wave frequency section on the high frequency side including the maximum modulation wave frequency $fs_{-max}$ in the modulation wave variable frequency range is the value obtained by multiplying the maximum modulation wave frequency $fs_{-max}$ by $(N_{min}/(N_{min}+2))$. On the other hand, the lowest minimum modulation wave frequency in the modulation wave variable frequency range is represented by $fs_{-min}$.

(a) In the Case of the Modulation Wave Frequency fs is High:

In the modulation wave frequency section on the high frequency side including the maximum modulation wave frequency $fs_{-max}$, a frequency value $(n_{-min} \cdot fs_{-max} \cdot (N_{min}/(N_{min}+2)))$ obtained by multiplying a product $(n_{-min} \cdot fs_{-max})$ of the maximum modulation wave frequency $fs_{-max}$ and a minimum harmonic order $n_{-min}$ resulting from the minimum number of PWM pulses $N_{min}$ associated with the maximum modulation wave frequency $fs_{-max}$ by $(N_{min}/(N_{min}+2))$ is used as a candidate for a cutoff frequency $f_{-cutoff}$. The minimum harmonic order $n_{-min}$ in is the lowest order at the maximum modulation wave frequency $fs_{-max}$. For example, when the selected minimum number of PWM pulses $N_{min}$ is "4", the minimum harmonic order $n_{-min}$ is "3", and thus the candidate for the cutoff frequency $f_{-cutoff}$ is $(3 \cdot fs_{-max} \cdot (2/3))$.

(b) In the Case of the Modulation Wave Frequency fs is Low:

When the modulation wave frequency fs is low, a frequency value $(n_{-min} \cdot fs_{-min})$ obtained by a product of the minimum modulation wave frequency $fs_{-min}$ in the modulation wave variable frequency range and the minimum harmonic order $n_{-min}$ resulting from the number of PWM pulses N associated with the minimum modulation wave frequency $fs_{-min}$ is used as a candidate for the cutoff frequency $f_{-cutoff}$. The minimum harmonic order $n_{-min}$ is the lowest order at the minimum modulation wave frequency $fs_{-min}$. For example, when the number of PWM pulses N is "14", the minimum harmonic order $n_{-min}$ is "23", and thus the cutoff frequency $f_{-cutoff}$ is $(23 \cdot fs_{-min})$.

(c) Cutoff Frequency

The lowest frequency among the candidates of the cutoff frequency $f_{-cutoff}$ obtained by the above items (a) and (b) is set as the cutoff frequency $f_{-cutoff}$.

(d) Selection of Cutoff Frequency

In comparison of a cutoff frequency $f_{-cutoff-max}=(n_{-min} \cdot fs_{-max} \cdot (N_{min}/(n_{min}+2)))$ of the modulation wave frequency fs in the modulation wave frequency section that includes the maximum modulation wave frequency $fs_{-max}$ with a cutoff frequency $f_{-cutoff-min}=n_{-min} \cdot fs_{-min}$ of the minimum modulation wave frequency $fs_{-min}$, provided that a ratio K between the cutoff frequencies $f_{-cutoff-max}$ and $f_{-cutoff-min}$ is $$K = f_{-cutoff-max}/f_{-cutoff-min}$$
$$= (n_{-min} \cdot fs_{-max} \cdot (N_{min}/(N_{min}+2)))/(n_{-min} \cdot fs_{-min}),$$

when K<1, $f_{-cutoff-max}=n_{-min} \cdot fs_{-max} \cdot N_{min}/(N_{min}+2)$ is selected as the cutoff frequency, and when K≥1, $f_{-cutoff-min}=n_{-min} \cdot fs_{-min}$ is selected as the cutoff frequency.

In the example that the order $n_{-min}$ in is set to 3 when the number $N_{min}$ is 4 and the frequency $fs_{-max}$ is 13.56 MHz while setting the order $n_{-min}$ to 23 when the number $N_{max}$ is 14 and the frequency $fs_{-min}$ is 2.59 MHz, the ratio K between the frequencies $f_{-cutoff-max}$ and $f_{-cutoff-min}$ is K=(3·13.56 MHz·(4/6))/(23·2.59 MHz)=0.455. Since this example shows the case of K<1, the cutoff frequency $f_{-cutoff-max}=n_{-min} \cdot fs_{-max} \cdot (N_{min}/(N_{min}+2))$ in the modulation wave frequency section on the high frequency side that include the maximum modulation wave frequency $fs_{-max}$ is selected.

FIG. 15 illustrates a cutoff frequency in the low-pass filter, in which FIGS. 15(a), 15(b) and 15(c) show the outlines of the characteristics of the number of PWM pulses N, the lowest harmonic order $n_{-min}$ and the lowest harmonic frequency $f_{n-min}$ for the modulation wave frequency fs. The number of PWM pulses N shown in FIG. 15(a) is an example that the minimum number of PWM pulses $N_{min}$ is "4" and the maximum number of PWM pulses $N_{max}$ is "14", and the lowest harmonic frequency $n_{-min}$ with respect to the number of PWM pulses N is "3" to "23" as shown in FIG. 15(b). In here, the lowest harmonic order appears from "23" when the maximum number of PWM pulses $N_{max}$ is "14", and the lowest harmonic order appears from "3" when the minimum number of PWM pulses $N_{min}$ is "4".

In the lowest harmonic frequency $f_{n-min}$ shown in FIG. 15(c), when the number of PWM pulses N is "4", the lowest harmonic frequency $f_{n-min}=n_{-min} \cdot fs_{-max} \cdot N_{min}/(N_{min}+2)$ is 27.12 MHz. In this case, the lowest harmonic order $n_{-min}$ is "3", and the frequency $fs_{-max}$ is 13.56 MHz. On the other hand, when the number of PWM pulses N is "14", the lowest harmonic frequency $f_{n-min}=$n−min·$fs_{-min}$ is 59.57 MHz. In this case, the lowest harmonic order $n_{-min}$ is "23", and the frequency $fs_{-min}$ is 2.59 MHz.

Thus, in this example, the value 27.12 MHz of the lowest harmonic frequency $f_{n-min}$ when the modulation wave frequency fs is the maximum frequency $fs_{-max}$ in the modulation wave variable frequency range is selected as the cutoff frequency $f_{-cutoff}$.

<Voltage Control>

A description will now be made about voltage control on the power supply. In the power supply of the invention, DC link voltage control or PWM control can be applied for the voltage control.

(DC Link Voltage Control)

The DC link voltage control is for controlling a voltage of a DC link for supplying a DC voltage of a DC power source to an inverter circuit to control a sinusoidal output voltage. FIG. 16 shows a configuration example for performing the DC link voltage control.

The power supply 1 includes a DC power source 2 that outputs a DC voltage, a PWM inverter 3 that converts the DC voltage supplied by the DC power source 2 into a sine wave, a DC link 20 that connects the DC power source 2 to the PWM inverter 3 to supply the DC voltage, a DC link voltage control unit 21 that controls the voltage in the DC link 20, a low-pass filter 4 that removes a harmonic component contained in an output from the PWM inverter 3, and an inverter controller 5 that performs the PWM control on the PWM inverter 3. The inverter controller 5 includes a PWM control unit 6 and a carrier wave generation unit 7. The constituent elements other than the DC link 20 and the DC link voltage control unit 21 are the same as those shown in FIG. 1. The voltage control on a sine wave output having a fundamental component is performed by the DC link voltage control unit 21 for controlling the voltage in the DC link 20.

(Voltage Control by PWM Control)

The voltage control by the PWM control on the voltage of the sine wave output is performed by the PWM control unit for controlling the PWM inverter 3. FIG. 17 shows a configuration example for performing the voltage control by the PWM control.

The power supply 1 includes the DC power source 2 that outputs a DC voltage, the PWM inverter 3 that converts the DC voltage supplied by the DC power source 2 into a sine wave, the low-pass filter 4 that removes a harmonic component in the sine wave output from the PWM inverter 3, and the inverter controller 5 that performs the PWM control on the PWM inverter 3. The inverter controller 5 includes the PWM control unit 6 and the carrier wave generation unit 7, and its configuration is the same as that shown in FIG. 1. The voltage control on the sine wave output is performed in such a way that the PWM control unit 6 controls a modulation factor.

The above description about each embodiment is an example of the wideband RF power supply according to the present invention, and the invention is not limited to these embodiments. Furthermore, the present invention can be modified in various ways based on the purport of the invention, which will not be excluded from the scope of the invention.

INDUSTRIAL APPLICABILITY

The driver device of the class-D full-bridge amplifier of the present invention can be applied to a radio-frequency power supply (RF generator) to be used for semiconductor manufacturing equipment, liquid crystal panel manufacturing equipment or others. The radio-frequency power supply, to which the driver device is applied, includes a variable voltage variable frequency (VVVF) power supply and a variable voltage constant frequency (VVCF) power supply, for instance.

REFERENCE SIGNS LIST

1 Power Supply (Wideband RF Power Supply)
2 DC Power Source
3 PWM Inverter
4 Low-Pass Filter
5 Inverter Controller
6 PWM Control Unit
7 Carrier Wave Generation Unit
7a Carrier Wave Upper And Lower Frequency Setting Unit
7b Modulation Wave Frequency Section Setting Unit
7c Carrier Wave Frequency Computation Unit
7d Carrier Wave Output Unit
7e Characteristic Data Storage Unit
7f Reading Unit
20 DC Link
21 DC Link Voltage Control Unit
30 Class-D Full-Bridge Circuit
Vd DC Voltage
$V_{inv}$ Inverter Output
$V_{out}$ Output Wave
Br Single-Phase Full-Bridge Circuit
C Carrier Wave
Ca Capacitor
Loss Switching Loss
N Number of PWM Pulses
$N_{const}$ Constant Value
$N_{max}$ Maximum Number of PWM Pulses
$N_{min}$ Minimum Number of PWM Pulses
Q1, Q2, Q3, Q4 Switching Element
R Load
S Modulation Wave
Tr Output Transformer
fc Carrier Wave Frequency
$fc_{-upper}$ Upper Limit Frequency
$fc_{-lower}$ Lower Limit Frequency
$f_{-cutoff}$ Cutoff Frequency
fn Harmonic Frequency
fs Modulation Wave Frequency

The invention claimed is:

1. A wideband RF power supply that outputs a sine wave over a wide band in an RF band, comprising:
a DC power source;
a single-phase PWM inverter that converts a direct current supplied by the DC power source into an alternate current;
an inverter controller that performs PWM control on the single-phase PWM inverter; and
a low-pass filter that removes a harmonic component from an inverter output of the single-phase PWM inverter,
wherein the inverter controller comprises a PWM control unit and a carrier wave generation unit,
wherein the carrier wave generation unit has:
a carrier wave variable frequency range in which a frequency is limited by an upper limit frequency and a lower limit frequency; and
a modulation wave variable frequency range that is divided into a plurality of modulation wave frequency sections associated with a number of PWM pulses N,
in each modulation wave frequency section, a modulation wave frequency fs and a number of PWM pulses N associated with the modulation wave frequency section being used to output a carrier wave at a carrier wave frequency fc which is defined based on a relationship of fc=N·fs, and
wherein the PWM control unit outputs a PWM pulse to be used to perform the PWM control on the inverter controller by comparing a modulation wave at the modulation wave frequency fs with the carrier wave, so as to output a sine wave at a frequency corresponding to a variable frequency of the modulation wave.

2. The wideband RF power supply according to claim 1, wherein the carrier wave generation unit comprises:
a carrier wave upper and lower limit frequency setting unit that sets an upper limit frequency and a lower limit frequency of the carrier wave;
a modulation wave frequency section setting unit that divides a whole modulation wave variable frequency range into sections to set a plurality of modulation wave frequency sections, each of which is associated with each number of PWM pulses N;
a carrier wave frequency computation unit that changes a number of PWM pulses N for the modulation wave frequency fs into a number of PWM pulses N associated with a modulation wave frequency section that includes the concerned modulation wave frequency fs in each modulation wave frequency section, so as to compute a carrier wave frequency fc by using the changed number of PWM pulses N and the modulation wave frequency fs based on the relationship of fc=N·fs; and a carrier wave output unit that outputs a carrier wave having the carrier wave frequency fc computed by the carrier wave frequency computation unit.

3. The wideband RF power supply according to claim 2, wherein the carrier wave upper and lower limit frequency setting unit uses a number of PWM pulses N=$N_{min}$ in a modulation wave frequency section on a high frequency side that includes a maximum modulation wave frequency $fs_{-max}$ in the modulation wave variable frequency range to set a carrier wave upper limit frequency $fc_{-upper}$=$N_{min}$·$fs_{-max}$ and a carrier wave lower limit frequency $fc_{-lower}$=$fc_{-upper}$·$N_{min}$/($N_{min}$+2), and the modulation wave frequency section setting unit sets, in the plurality of modulation wave frequency sections, a maximum frequency $fs_{-max}$=$fc_{-upper}$/$N_{min}$ and a minimum frequency $fc_{-lower}$/$N_{min}$ of a modulation wave frequency in a modulation wave frequency section $N_{min}$ on a high frequency side that includes the maximum frequency of the modulation wave, and in a relationship of N>$N_{min}$ in a modulation wave frequency section on a low frequency side,
(a) when the carrier wave frequency is shifted to the lower limit frequency $fc_{-lower}$, sets a maximum frequency $fc_{-lower}$/(N−2) and a minimum frequency $fc_{-lower}$/N of the modulation wave frequency, and
(b) when the carrier wave frequency is shifted to the upper limit frequency $fc_{-upper}$, sets a maximum frequency $fc_{-upper}$/N and a minimum frequency $fc_{-upper}$/(N+2) of the modulation wave frequency.

4. The wideband RF power supply according to claim 1, wherein the carrier wave generation unit comprises:

a characteristic data storage unit that stores the plurality of modulation wave frequency sections obtained by dividing the modulation wave variable frequency range into sections and setting each section by associating with the number of PWM pulses N;

a reading unit that reads a modulation wave frequency section that includes the modulation wave frequency fs and the corresponding number of PWM pulses input in the characteristic data storage unit;

carrier wave frequency computation unit that changes the number of PWM pulses N for the modulation wave frequency fs in each modulation wave frequency section into the number of PWM pulses N that is associated with a modulation wave frequency section including the concerned modulation wave frequency fs, and computes the carrier wave frequency fc by using the number of PWM pulses N thus changed and the modulation wave frequency fs based on the relationship of fc=N·fs; and a carrier wave output unit that outputs a carrier wave having the carrier wave frequency fc computed by the carrier wave frequency computation unit.

5. The wideband RF power supply according to claim 1, wherein the number of PWM pulses N is an even number, the number of PWM pulses N associated with a modulation frequency section on a highest frequency side that includes the maximum frequency of the modulation wave is the minimum number of PWM pulses $N_{min}$ having the smallest even number, and the numbers of PWM pulses N associated with the modulation wave frequency section on the low frequency side are the values obtained by adding 2 to the number of PWM pulses N in order from the high frequency side to the low frequency side.

6. The wideband RF power supply according to claim 5, wherein the minimum number of PWM pulses $N_{min}$ is 4.

7. The wideband RF power supply according to claim 1, wherein the carrier wave has a waveform of an odd function or an even function.

8. The wideband RF power supply according to claim 1, wherein a cutoff frequency of the low-pass filter is either of the following values which is smaller:

a product ($n_{-min}$·$fs_{-min}$($N_{min}$)) of the minimum modulation wave frequency $fs_{-min}$($N_{min}$) and a lowest harmonic order $n_{-min}$ resulting from the minimum number of PWM pulses $N_{min}$ associated with the modulation wave frequency section in the modulation wave frequency section on the high frequency side including the maximum modulation wave frequency $fs_{-max}$ in the modulation wave variable frequency range; or a product ($n_{-min}$·$fs_{-min}$) of the most minimum modulation wave frequency $fs_{-min}$ and the lowest harmonic order $n_{-min}$ resulting from the minimum number of PWM pulses associated with the modulation wave frequency section in the modulation wave frequency section on the low frequency side including the minimum modulation wave frequency $fs_{-min}$ in the modulation wave variable frequency range.

9. The wideband RF power supply according to claim 8, wherein in the modulation wave frequency section on the high frequency side including the maximum modulation wave frequency $fs_{-max}$ in the modulation wave variable frequency range, the most minimum modulation wave frequency $fs_{-min}$($N_{min}$) is obtained by multiplying the maximum modulation wave frequency $fs_{-max}$ by a value (($N_{min}$/($N_{min}$+2)).

10. A control method for a wideband RF power supply that compares a modulation wave with a carrier wave in a PWM inverter to variably output a sine wave output frequency in an RF band, wherein generation of the carrier wave comprises:
(a) a carrier wave upper and lower limit frequency setting step for setting an upper limit frequency and a lower limit frequency of the carrier wave;
(b) a modulation wave frequency section setting step for dividing a whole modulation wave variable frequency range into sections to set a plurality of modulation wave frequency sections, each of which is associated with each number of PWM pulses N;
(c) a carrier wave frequency computing step for changing to a number of PWM pulses N that is associated with a modulation wave frequency section which includes the modulation wave frequency fs in a modulation wave frequency fs, and computing a carrier wave frequency fc by using the changed number of PWM pulses N and the variable modulation wave frequency fs based on a relationship of fc=N·fs;
(d) a carrier wave outputting step for outputting a carrier wave at the carrier wave frequency fc computed in the carrier wave frequency computing step;
(e) a PWM pulse outputting step for comparing a modulation wave at the modulation wave frequency fs with the carrier wave output in the carrier wave outputting step, so as to output a PWM pulse for performing PWM control on the PWM inverter; and
(f) an outputting step for outputting a sine wave having an output frequency corresponding to the modulation wave frequency fs.

11. The control method for the wideband RF power supply according to claim 10, wherein the carrier wave upper and lower limit frequency setting step uses a number of PWM pulses $N=N_{min}$ in a modulation wave frequency section on a high frequency side that includes a maximum modulation wave frequency $fs_{-max}$ in the modulation wave variable frequency range to set a carrier wave upper limit frequency $fc_{-upper}=N_{min} \cdot fs_{-max}$ and a carrier wave lower limit frequency $fc_{-lower}=fc_{-upper} \cdot N_{min}/(N_{min}+2)$, and the modulation wave frequency section setting step sets, in the plurality of modulation wave frequency sections, a maximum frequency $fs_{-max}=fc_{-upper}/N_{min}$ and a minimum frequency $fc_{-lower}/N_{min}$ of a modulation wave frequency in a modulation wave frequency section $N_{min}$ on a high frequency side that includes the maximum frequency of a modulation wave, and in a relationship of $N>N_{min}$ in a modulation wave frequency section on a low frequency side, (a) when the carrier wave frequency is shifted to the lower limit frequency $fc_{-lower}$, sets a maximum frequency $fc_{-lower}/(N-2)$ and a minimum frequency $fc_{-lower}/N$ of the modulation wave frequency, and (b) when the carrier wave frequency is shifted to the upper limit frequency $fc_{-upper}$, sets a maximum frequency $fc_{-upper}/N$ and a minimum frequency $fc_{-upper}/(N+2)$ of the modulation wave frequency.

12. The control method for the wideband RF power supply according to claim 10, wherein the number of PWM pulses N is an even number, the number of PWM pulses N associated with a modulation frequency section on a highest frequency side that includes the maximum frequency of the modulation wave is the minimum number of PWM pulses $N_{min}$ having the smallest even number, and the numbers of PWM pulses N associated with the modulation wave frequency section on the low frequency side are values obtained by adding 2 to the number of PWM pulses N in order from the high frequency side to the low frequency side.

13. The control method for the wideband RF power supply according to claim 12, wherein the minimum number of PWM pulses $N_{min}$ is selected based on a balance of increase/decrease characteristics between increase characteristics in which a switching loss increases as the minimum number of PWM pulses $N_{min}$ increases and decrease characteristics in which an amount of generated harmonics decreases as the minimum number of PWM pulses $N_{min}$ increases.

14. The control method for the wideband RF power supply according to claim 10, wherein the outputting step selects a cutoff frequency of a low-pass filter for removing a harmonic component from an inverter output in the PWM inverter as below, on a basis of a ratio K between a cutoff frequency $f_{-cutoff-max}=n_{-min} \cdot fs_{-max} \cdot (N_{min}/(n_{min}+2))$ of the modulation wave frequency fs in a modulation wave frequency section that includes a maximum modulation wave frequency $fs_{-max}$ and a cutoff frequency $f_{-cutoff-min}=n_{-min} \cdot fs_{-min}$ of a minimum modulation wave frequency $fs_{-min}$:

when K<1, selects $f_{-cutoff-max}=n_{-min} \cdot fs_{-max} \cdot N_{min}/(N_{min}+2)$ as the cutoff frequency; and when K≥1, selects $f_{-cutoff-min}=n_{-min} \cdot fs_{-min}$ as the cutoff frequency.

* * * * *